(12) United States Patent
Kim et al.

(10) Patent No.: US 10,910,374 B2
(45) Date of Patent: Feb. 2, 2021

(54) SEMICONDUCTOR DEVICE

(71) Applicant: Samsung Electronics Co., Ltd., Suwon-si (KR)

(72) Inventors: Sung Min Kim, Incheon (KR); Dong Won Kim, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/926,360

(22) Filed: Jul. 10, 2020

(65) Prior Publication Data

US 2020/0343243 A1 Oct. 29, 2020

Related U.S. Application Data

(62) Division of application No. 16/372,534, filed on Apr. 2, 2019, now Pat. No. 10,748,897.

(30) Foreign Application Priority Data

Apr. 10, 2018 (KR) ........................ 10-2018-0041385

(51) Int. Cl.
| | | |
|---|---|---|
| *H01L 27/088* | (2006.01) | |
| *H01L 29/78* | (2006.01) | |
| *H01L 29/10* | (2006.01) | |
| *H01L 21/8234* | (2006.01) | |
| *H01L 21/768* | (2006.01) | |
| *H01L 29/66* | (2006.01) | |

(52) U.S. Cl.
CPC .... *H01L 27/0886* (2013.01); *H01L 21/76832* (2013.01); *H01L 21/823412* (2013.01); *H01L 21/823431* (2013.01); *H01L 21/823437* (2013.01); *H01L 29/1033* (2013.01); *H01L 29/66795* (2013.01); *H01L 29/785* (2013.01)

(58) Field of Classification Search
CPC .......... H01L 27/0886; H01L 21/76832; H01L 29/1033; H01L 21/823412; H01L 21/723437; H01L 21/823431
See application file for complete search history.

(56) References Cited

U.S. PATENT DOCUMENTS

| | | |
|---|---|---|
| 7,224,029 B2 | 5/2007 | Anderson et al. |
| 7,612,405 B2 | 11/2009 | Yu et al. |
| 7,842,559 B2 | 11/2010 | Jakschik et al. |
| 8,101,994 B2 | 1/2012 | Yu et al. |
| 9,048,259 B2 | 6/2015 | Hung et al. |
| 9,443,935 B2 | 9/2016 | Oh et al. |
| 9,525,068 B1 | 12/2016 | Gupta et al. |
| 9,722,025 B2 | 8/2017 | Chang et al. |
| 9,735,042 B2 | 8/2017 | Hung et al. |

*Primary Examiner* — Anthony Ho

(74) *Attorney, Agent, or Firm* — Muir Patent Law, PLLC

(57) ABSTRACT

A semiconductor device is provided, which includes a first and second multichannel active patterns spaced apart from one another and extending in a first direction. The semiconductor device also includes first and second gate structures on the first and second multichannel active patterns, extending in a second direction and including first and second gate insulating films, respectively. Sidewalls of the first multichannel active pattern include first portions in contact with the first gate insulating film, second portions not in contact with the first gate insulating film, third portions in contact with the second gate insulating film, and fourth portions not in contact with the second gate insulating film. Additionally, a height of the first portions of the first multichannel active pattern is greater than a height of the third portions of the first multichannel active pattern.

20 Claims, 36 Drawing Sheets

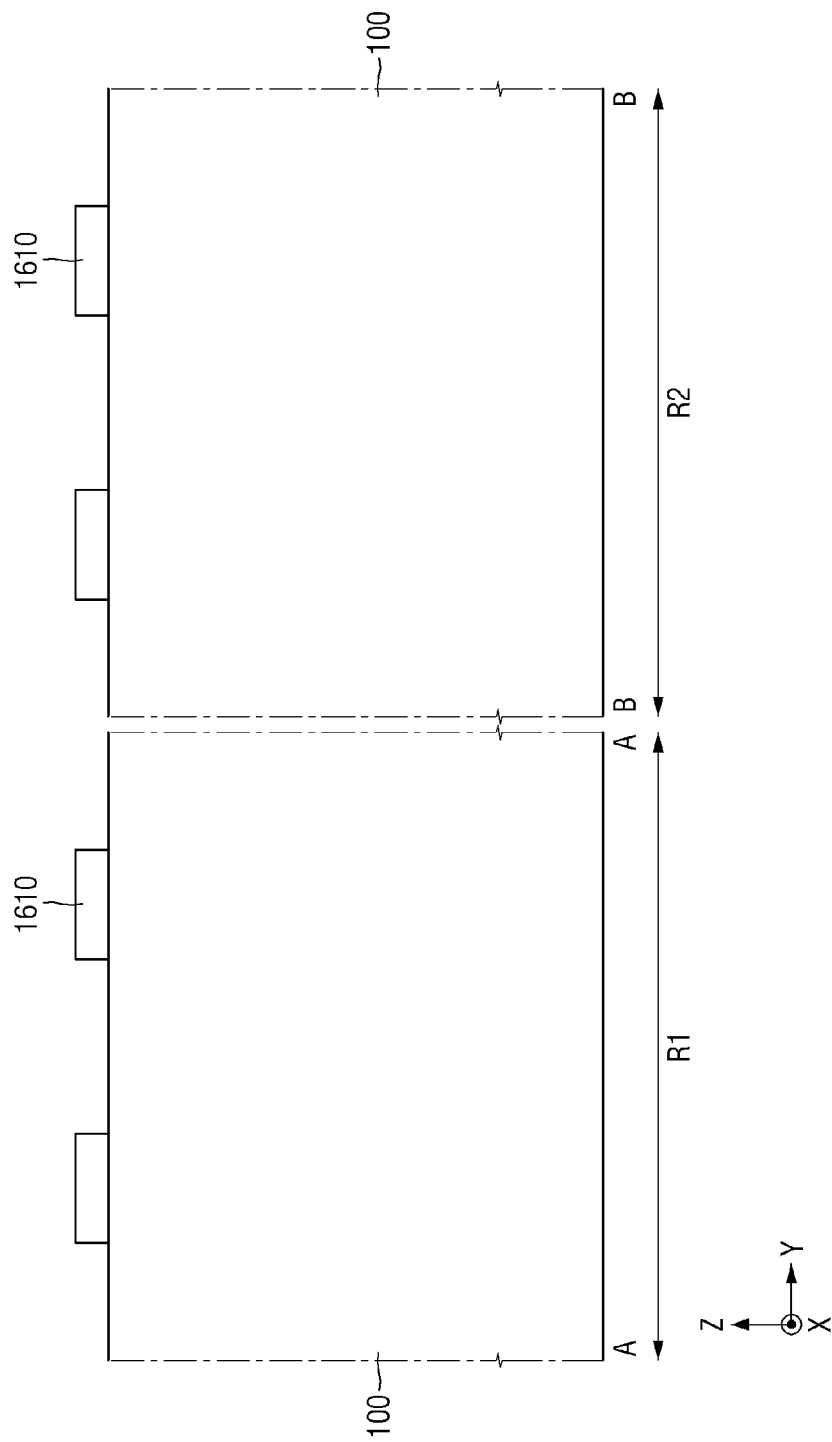

SEMICONDUCTOR DEVICE

This application is a continuation of U.S. patent application Ser. No. 16/372,534, filed Apr. 2, 2019, in the U.S. Patent and Trademark Office (USPTO), which claims the benefit of priority under 35 U.S.C. § 119 to Korean Patent Application No. 10-2018-0041385, filed Apr. 10, 2018, in the Korean Intellectual Property Office, the disclosure of which is incorporated herein by reference in its entirety.

BACKGROUND

1. Field

The present disclosure relates to a semiconductor device, and more particularly, to a semiconductor device including multichannel active patterns having different channel regions.

2. Description of the Related Art

Current scaling technologies may utilize a multi-gate transistor for increasing the integration density of a semiconductor device. In some multi-gate transistors, a fin-shaped multichannel active pattern (e.g., a silicon body) is formed on a substrate, and a gate is formed on the surface of the multichannel active pattern.

The multi-gate transistor uses a three-dimensional (3D) channel which can assist with scaling semiconductor devices implementing the same. In addition, the current control capability of the multi-gate transistor can be improved without increasing the gate length of the multi-gate transistor. Furthermore, a short channel effect (SCE) in which the electrical potential of a channel region is influenced by a drain voltage can be effectively suppressed.

SUMMARY

Example embodiments of the present disclosure provide a semiconductor device including various channels.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to some example embodiments, the disclosure is directed to a semiconductor device comprising: a first multichannel active pattern extending in a first direction; a second multichannel active pattern spaced apart from the first multichannel active pattern and extending in the first direction; a first gate structure disposed on the first and second multichannel active patterns, extending in a second direction perpendicular to the first direction, and including a first gate insulating film; and a second gate structure disposed on the first and second multichannel active patterns, extending in the second direction, spaced apart from the first gate structure, and including a second gate insulating film, wherein sidewalls of the first multichannel active pattern include first portions in contact with the first gate insulating film, second portions not in contact with the first gate insulating film, third portions in contact with the second gate insulating film, and fourth portions not in contact with the second gate insulating film, and wherein a height of the first portions of the first multichannel active pattern is greater than a height of the third portions of the first multichannel active pattern.

According to some example embodiments, the disclosure is directed to a semiconductor device comprising: a first fin-type pattern extending in a first direction and including first and second regions; a field insulating film disposed on parts of sidewalls of the first fin-type pattern; a first gate structure formed on the field insulating film to intersect the first region of the first fin-type pattern; and a second gate structure formed on the field insulating film to intersect the second region of the first fin-type pattern, wherein a height to which the first region of the first fin-type pattern protrudes above a top surface of the field insulating film is greater than a height to which the second region of the first fin-type pattern protrudes above the top surface of the field insulating film.

According to some example embodiments, the disclosure is directed to a semiconductor device comprising: a first multichannel active pattern extending in a first direction; a first gate structure extending in a second direction, which is perpendicular to the first direction, over the first multichannel active pattern; and a second gate structure extending in the second direction over the first multichannel active pattern and spaced apart from the first gate structure, wherein the first multichannel active pattern includes a first region in which the first multichannel active pattern intersects the first gate structure and a second region in which the first multichannel active pattern intersects the second gate structure, wherein in the first region of the first multichannel active pattern, the first multichannel active pattern has a first channel, wherein in the second region of the first multichannel active pattern, the first multichannel active pattern has a second channel, and wherein an effective channel width of the first channel is greater than an effective channel width of the second channel.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which:

FIGS. 16 through 34 are cross-sectional views illustrating a method of fabricating a semiconductor device according to some example embodiments of the present disclosure.

DETAILED DESCRIPTION

Figure 1:
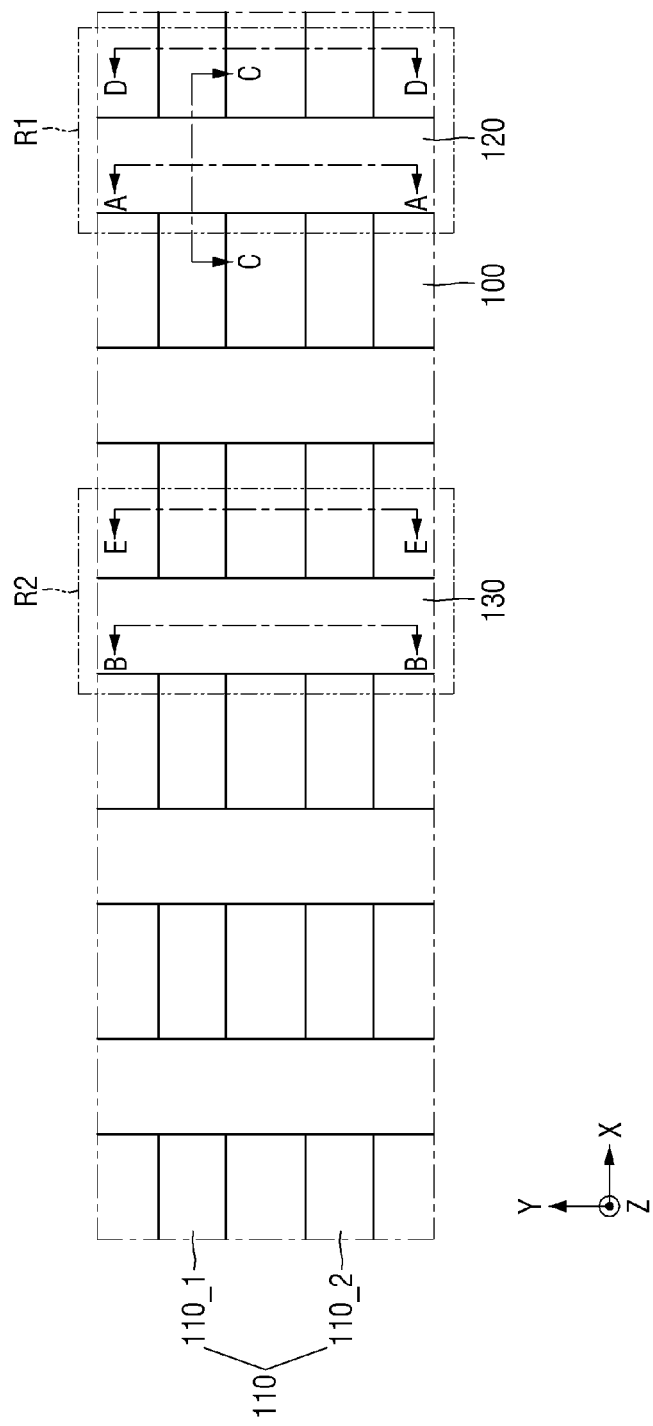
FIG. 1 is a plan view of a semiconductor device according to some example embodiments of the present disclosure.
Figure 2:
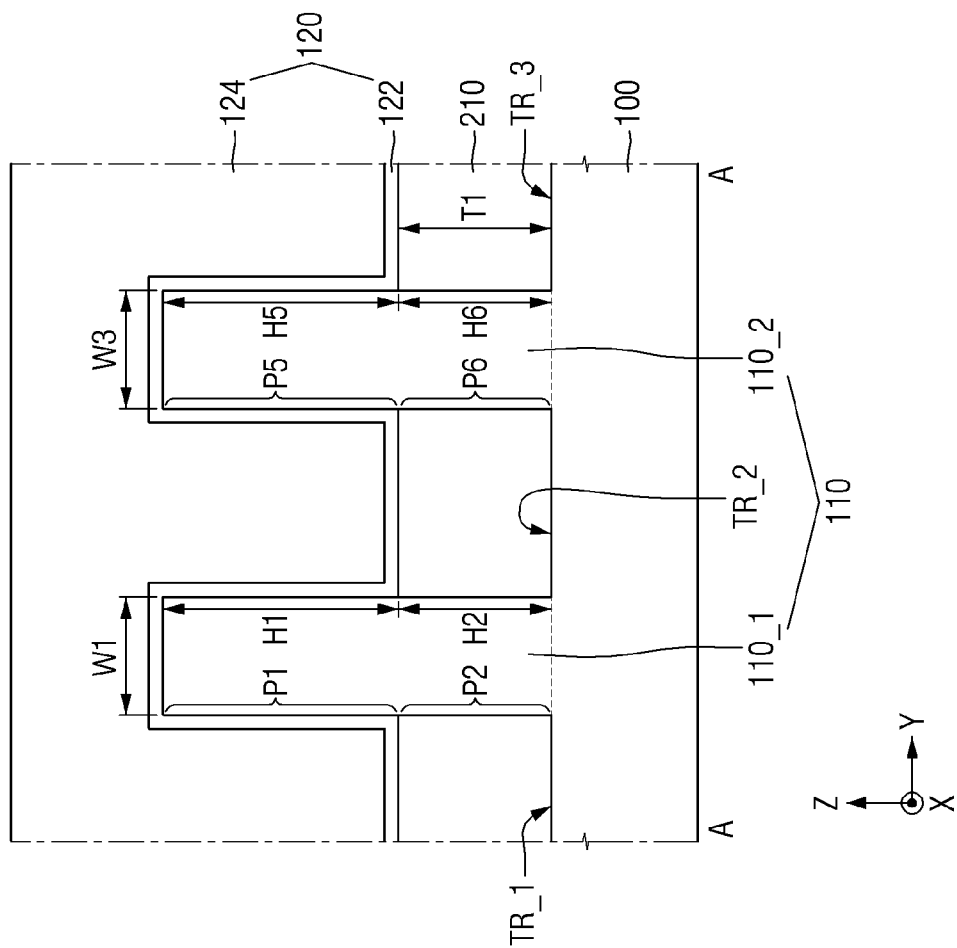
FIGS. 2, 7, and 9 are cross-sectional views taken along line A-A of FIG. 1.
Figure 3:
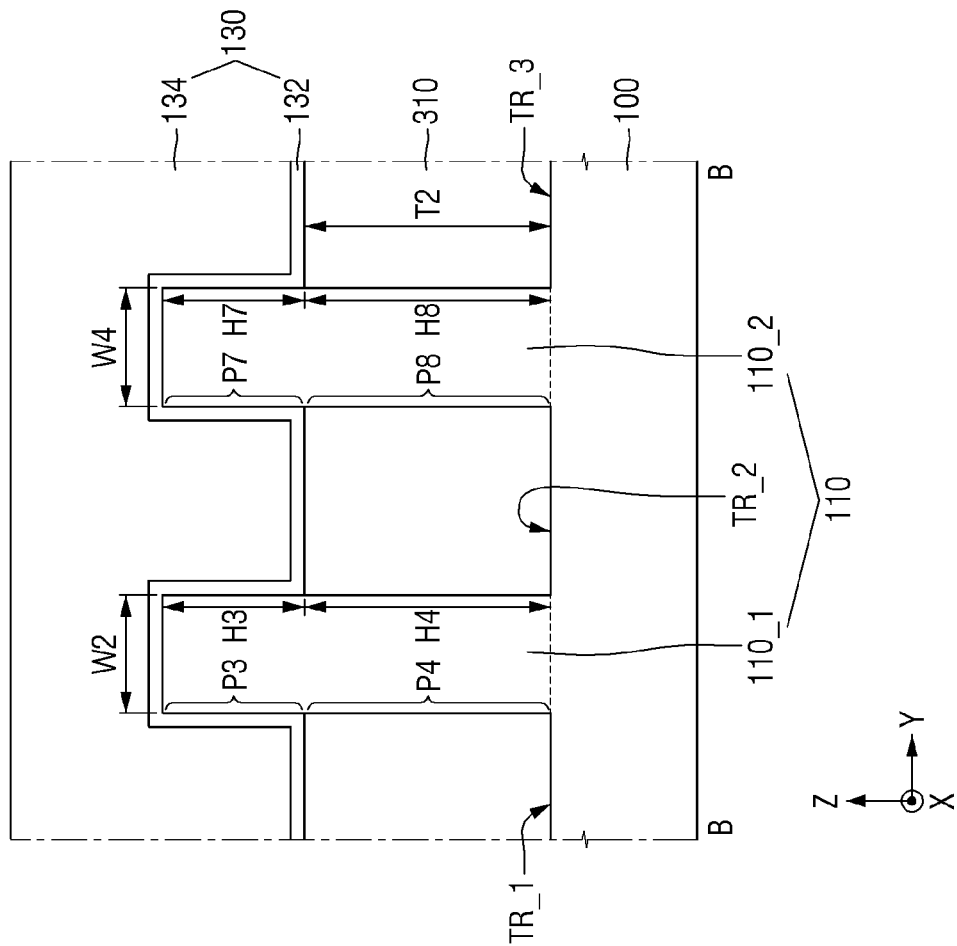
FIGS. 3, 8, and 10 through 15 are cross-sectional views taken along line B-B of FIG. 1.
Figure 4:
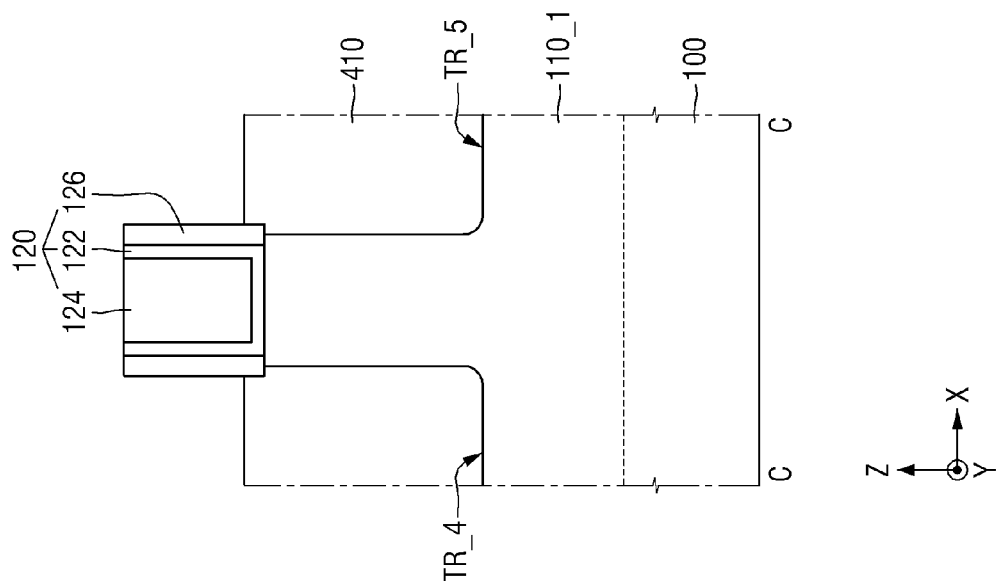
FIG. 4 is a cross-sectional view taken along line C-C of FIG. 1.
Figure 5:
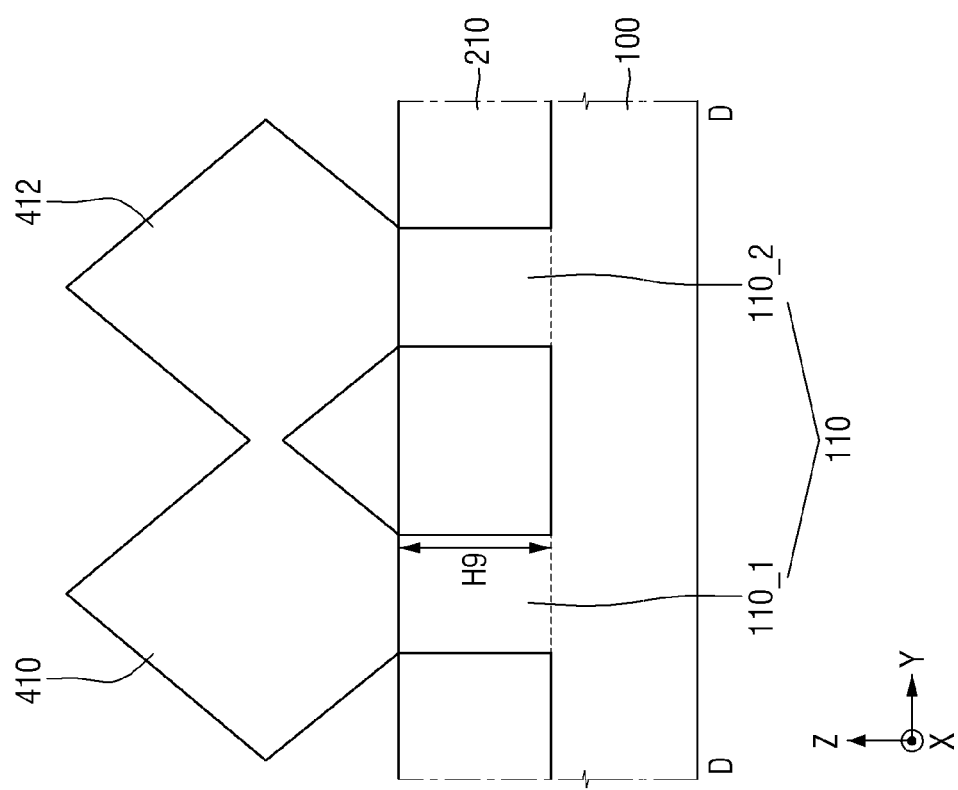
FIG. 5 is a cross-sectional view taken along line D-D of FIG. 1.
Figure 6:
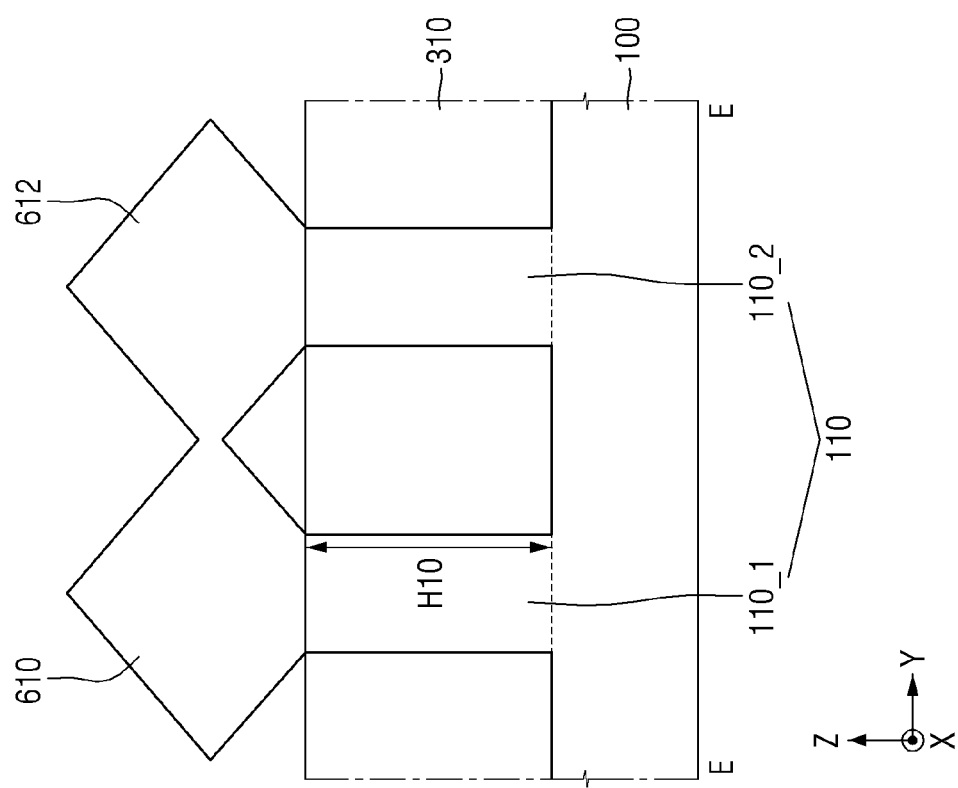
FIG. 6 is a cross-sectional view taken along line E-E of FIG. 1.
Figure 7:
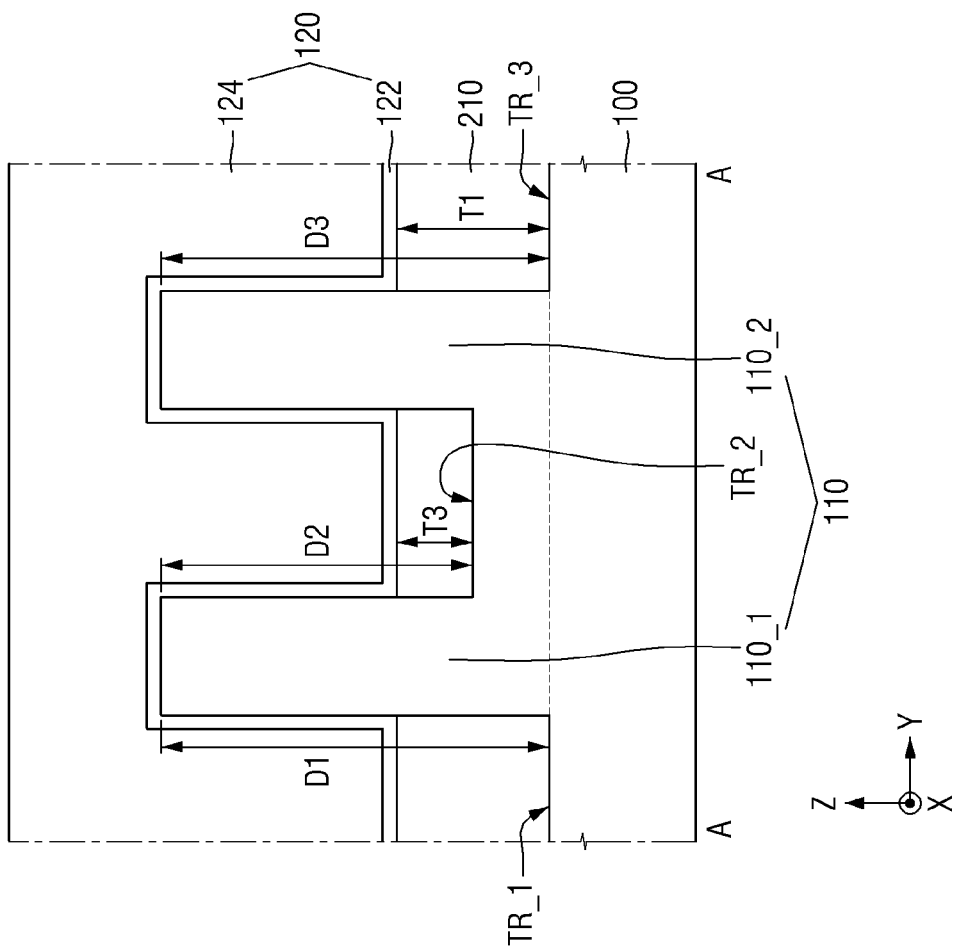

FIG. 1 is a plan view of a semiconductor device according to some example embodiments of the present disclosure. FIGS. 2, 7, and 9 are cross-sectional views taken along line A-A of FIG. 1. FIGS. 3, 8, and 10 through 15 are cross-sectional views taken along line B-B of FIG. 1. FIG. 4 is a cross-sectional view taken along line C-C of FIG. 1. FIG. 5 is a cross-sectional view taken along line D-D of FIG. 1. FIG. 6 is a cross-sectional view taken along line E-E of FIG. 1.

For convenience, FIGS. 1 through 15 illustrate only some of the elements of the semiconductor device according to some example embodiments of the present disclosure. For example, some of the elements of the semiconductor device according to some example embodiments of the present disclosure are not illustrated in FIGS. 1 through 15 for clarity. For example, FIG. 1 does not illustrate a field insulating film, an interlayer insulating film, and the like. However, it would be obvious to one of ordinary skill in the art which elements of the semiconductor device according to some example embodiments of the present disclosure are not illustrated in FIGS. 1 through 15.

Referring to FIGS. 1 through 6, the semiconductor device according to some example embodiments of the present disclosure may include a substrate 100, a plurality of multichannel active patterns 110, a first gate structure 120, a second gate structure 130, and first, second, third, and fourth epitaxial patterns 410, 412, 610, and 612. For example, the semiconductor device according to some example embodiments of the present disclosure may be a transistor.

In some example embodiments, the substrate 100 may be, for example, a bulk silicon substrate. The substrate 100 may be a silicon substrate or may comprise another material such as, for example, silicon germanium, indium antimonide, lead tellurium compound, indium arsenide, indium phosphide, gallium arsenide, or gallium antimonide.

In some example embodiments, the multichannel active patterns 110 may include a first multichannel active pattern 110_1 and a second multichannel active pattern 110_2. The first multichannel active pattern 110_1 may extend in a first direction X. The second multichannel active pattern 110_2 may be spaced apart from the first multichannel active pattern 110_1 in a second direction Y, perpendicular to the first direction X. The second multichannel active pattern 110_2 may extend in the first direction X. For example, the first and second multichannel active patterns 110_1 and 110_2 may be spaced apart in the second direction Y and may extend in parallel with one another in the first direction X. Unless the context indicates otherwise, elements described as "extending" in a first direction X or a second direction Y direction may have a length dimension that is larger than a width dimension, and the extension is in the length dimension.

multichannel active patterns 110, including the first multichannel active pattern 110_1 and the second multichannel active pattern 110_2, may have the same widths (in the second direction Y) and heights (in the third direction Z) with respect to cross-sectional views, but may have different lengths (in the first direction X). In addition, each of the multichannel active patterns 110, including the first multichannel active pattern 110_1 and the second multichannel active pattern 110_2, may extend from the same first level (in the third direction Z) and end at the same second level (in the third direction Z). For each of the multichannel active patterns 110, including the first multichannel active pattern 110_1 and the second multichannel active pattern 110_2, the entire top surface may have the same height. For example, the first multichannel active pattern 110_1 may have the same height (in the Z direction) between the first gate structure 120 and the second gate structure 130, and the second multichannel active pattern 110_2 may have the same height (in the third direction Z) between the first gate structure 120 and the second gate structure 130. The channel regions of the multichannel active patterns 110 may be on the sidewalls of the multichannel active patterns 110 and on top surfaces of the multichannel active patterns 110 at locations where gates structures (e.g., first and second gate structures 120 and 130) cross over the multichannel active patterns 110.

In some example embodiments, the multichannel active patterns 110 may have any one of a fin structure, a multichannel fin structure, and a nanowire structure, but the present disclosure is not limited.

The multichannel active patterns 110 may be parts of the substrate 100 or may include an epitaxial layer grown from the substrate 100. The multichannel active patterns 110 may comprise, for example, an element semiconductor material such as silicon or germanium. The multichannel active patterns 110 may also comprise, for example, a group IV-IV compound semiconductor or a group III-V compound semiconductor.

For example, in a case where the multichannel active patterns 110 comprise a group IV-IV compound semiconductor, the multichannel active patterns 110 may comprise a binary compound, a ternary compound, a binary compound doped with a group IV element, or a ternary compound doped with a group IV element, each of which contains at least two of carbon (C), silicon (Si), germanium (Ge), and tin (Sn). In another example, in a case where the multichannel active patterns 110 comprise a group III-V compound semiconductor, the multichannel active patterns 110 may comprise a binary compound, a ternary compound, or a quaternary compound, each of which is formed by combining at least one group III element such as aluminum (Al), gallium (Ga), and indium (In) and at least one group V element such as phosphorus (P), arsenic (As), and antimony (Sb). In the description that follows, the multichannel active patterns 110 are assumed to be silicon patterns, unless specified otherwise.

In some example embodiments, the first gate structure 120 may extend in the second direction Y. The second gate structure 130 may be spaced apart from the first gate structure 120 in the first direction X. The second gate structure 130 may extend in the second direction Y. For example, the first and second gate structures 120 and 130 may be spaced apart in the first direction X and may extend in parallel with one another in the Y direction. In some example embodiments, the first and second gate structures 120 and 130 may be formed by gate last processing or replacement processing.

For the convenience of description, the semiconductor device according to some example embodiments of the present disclosure may be divided into first and second regions R1 and R2. In some example embodiments, first and second field insulating films (210 of FIGS. 2 and 5 and 310 of FIGS. 3 and 6) are formed on the substrate 100 to surround parts of the multichannel active patterns 110. The structure of a stack of the substrate 100 and the first field insulating film 210 in the first region R1 may differ from the structure of a stack of the substrate 100 and the second field insulating film 310 in the second region R2. However, the division of the semiconductor device according to some example embodiments of the present disclosure into the first and second regions R1 and R2 is merely for the convenience of description, and the present disclosure is not limited.

In the first region R1, the semiconductor device according to some example embodiments of the present disclosure may include the substrate 100, the first multichannel active pattern 110_1, the second multichannel active pattern 110_2, the first field insulating film 210, and the first gate structure 120. In the description that follows, the semiconductor device according to some example embodiments of the present disclosure is assumed to have only two multichannel active patterns 110, but the present disclosure is not limited.

In some example embodiments, the first and second multichannel active patterns 110_1 and 110_2 may be defined along the first direction X by first, second, and third trenches TR_1, TR_2, and TR_3. For example, the first trench TR_1 may be spaced apart from the second trench TR_2 in the second direction Y. The first and second trenches TR_1 and TR_2 may extend in the first direction X and may thus define the first multichannel active pattern 110_1, which extends in the first direction X. The third trench TR_3 may be spaced apart from the second trench TR_2 in the second direction Y. The second and third trenches TR_2 and TR_3 may extend in the first direction X and may thus define the second multichannel active pattern 110_2, which extends in the first direction X. For example, the first trench TR_1 may be formed along a sidewall of the first multichannel active pattern 110_1, the third trench TR_3 may be formed along a sidewall of the second multichannel active pattern 110_2, and the second trench TR_2 may be formed along another sidewall of the first multichannel active pattern 110_1 and another sidewall of the second multichannel active pattern 110_2.

The first field insulating film 210 may be formed on the sidewalls of each of the multichannel active patterns 110 and on the substrate 100. In some embodiments, the first field insulating film 210 may be formed on the substrate 100 to cover parts of the sidewalls of each of the multichannel active patterns 110. For example, the first field insulating film 210 may be formed on the substrate 100 to fill portions of the first, second, and third trenches TR_1, TR_2, and TR_3.

The first field insulating film 210 may include at least one of, for example, an oxide film, a nitride film, an oxynitride film, and a combination thereof, but the present disclosure is not limited.

The first gate structure 120 may include a first gate insulating film 122, a first gate electrode 124, and first gate spacers 126.

The first gate insulating film 122 may be formed on the first field insulating film 210. Also, the first gate insulating film 122 may be formed along the profile of the top surface and parts of the sidewalls of each of the multichannel active patterns 110. For example, the first gate insulating film 122 may be formed conformally along the boundary between the top surface of the first field insulating film 210 and each of the multichannel active patterns 110.

The first gate insulating film 122 may comprise a high-k material having a higher dielectric constant than a silicon oxide film. For example, the first gate insulating film 122 may comprise at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited.

The first gate electrode 124 may be formed on the first gate insulating film 122. The first gate electrode 124 is illustrated as being a single-layer film, but the present disclosure is not limited. For example, in alternative embodiments, the first gate electrode 124 may be formed as a multilayer film consisting of multiple work function metal layers.

Referring to FIG. 4, the first gate spacers 126 may extend in the second direction Y. The first gate spacers 126 may be formed on the sidewalls of the first gate electrode 124. The first gate spacers 126 may be formed as single-layer films, but the present disclosure is not limited. For example, in alternative embodiments, the first gate spacers 126 may be formed as multilayer films. The first gate spacers 126 may comprise at least one of, for example, silicon nitride (SiN), silicon oxynitride (SiON), silicon oxide (SiO$_2$), silicon oxycarbonitride (SiOCN), and a combination thereof.

In the second region R2, the semiconductor device according to some example embodiments of the present disclosure may include the substrate 100, the first multichannel active pattern 110_1, the second multichannel active pattern 110_2, the second field insulating film 310, and the second gate structure 130. For convenience, descriptions of elements or features that have already been described above will be omitted or at least simplified.

In some example embodiments, the second field insulating film 310 may be formed on parts of the sidewalls of each of the multichannel active patterns 110. For example, the second field insulating film 310 may be formed on the substrate 100 to cover parts of the sidewalls of each of the multichannel active patterns 110. For example, the second field insulating film 310 may be formed on the substrate 100 to fill portions of the first, second, and third trenches TR_1, TR_2, and TR_3.

The second field insulating film 310 may comprise the same material as the first field insulating film 210.

In some example embodiments, the second gate structure 130 may include a second insulating film 132, a second gate electrode 134, and second gate spacers (not shown).

The second gate insulating film 132 may be formed on the second field insulating film 310. Also, the second gate insulating film 132 may be formed along the profile of the top surface and parts of the sidewalls of each of the multichannel active patterns 110. For example, the second gate insulating film 132 may be formed conformally along the boundary between the top surface of the second field insulating film 310 and each of the multichannel active patterns 110.

The second gate electrode 134 may be formed on the second gate insulating film 132.

The second gate spacers may extend in the second direction Y. The second gate spacers may be formed on the sidewalls of the second gate electrode 134.

In some example embodiments, the second gate structure 130 may comprise the same material as the first gate structure 120. For example, the second gate insulating film 132 may comprise the same material as the first gate insulating film 122, the second gate electrode 134 may comprise the same material as the first gate electrode 124, and the second gate spacers may comprise the same material as the first gate spacers 126.

As used herein, the expression "two elements comprising the same material" means that the identified two elements are formed by the same process. For example, the first and second gate structures 120 and 130 may be formed by the same process, but the present disclosure is not limited. For example, the elements of the semiconductor device according to some example embodiments of the present disclosure may be formed by different processes.

In the first region R1, the first multichannel active pattern 110_1 may include first portions P1 in contact with the first gate insulating film 122 and second portions P2 not in contact with the first gate insulating film 122. The first portions P1 may protrude in the third direction Z from a level of the top surface of the first field insulating film 210 to the top surface of the first multichannel active pattern 110_1, and the second portions P2 may protrude in the third direction Z from a top surface of the substrate 100 to the level of the top surface of the first field insulating film 210. In the second region R2, the first multichannel active pattern 110_1 may include third portions P3 in contact with the second gate insulating film 132 and fourth portions P4 not in contact with the second gate insulating film 132. The third portions P3 may protrude in the third direction Z from a level of the top surface of the second field insulating film 310 to the top surface of the first multichannel active pattern 110_1, and the fourth portions P4 may protrude in the third direction Z from the top surface of the substrate 100 to the level of the top surface of the second field insulating film 310.

In the first region R1, the second multichannel active pattern 110_2 may include fifth portions P5 in contact with the first gate insulating film 122 and sixth portions P6 not in contact with the first gate insulating film 122. The fifth portions P5 may protrude in the third direction Z from a level of the top surface of the first field insulating film 210 to the top surface of the second multichannel active pattern 110_2, and the sixth portions P6 may protrude in the third direction Z from a top surface of the substrate 100 to the level of the top surface of the first field insulating film 210. In the second region R2, the second multichannel active pattern 110_2 may include seventh portions P7 in contact with the second gate insulating film 132 and eighth portions P8 not in contact with the second gate insulating film 132. The seventh portions P7 may protrude in the third direction Z from a level of the top surface of the second field insulating film 310 to the top surface of the second multichannel active pattern 110_2, and the eight portions P8 may protrude in the third direction Z from the top surface of the substrate 100 to the level of the top surface of the second field insulating film 310.

As used herein, the expression "two elements being in contact with each other" means that there is no third element formed between the identified two elements at the point of contact (e.g., a connection contact (i.e., touching)) unless the context indicates otherwise. For example, there is no film formed between the first gate insulating film 122 and the sidewalls of the first multichannel active pattern 110_1.

The first portions P1 may have a first height H1 that is measured in the third direction Z from the level of the top surface of the first field insulating film 210 to the top surface of the first multichannel active pattern 110_1, and the second portions P2 may have a second height H2 that is measured in the third direction Z from the top surface of the substrate 100 to the level of the top surface of the first field insulating film 210. The third portions P3 may have a third height H3 that is measured in the third direction Z from the level of the top surface of the second field insulating film 310 to the top surface of the first multichannel active pattern 110_1, and the fourth portions P4 may have a fourth height H4 in the third direction Z that is measured from the top surface of the substrate 100 to the level of the top surface of the second field insulating film 310.

In some example embodiments, a first height H1 of the first portions P1 of the first multichannel active pattern 110_1 may be greater than a third height H3 of the third portions P3 of the first multichannel active pattern 110_1. In some embodiments, a second height H2 of the second portions P2 of the first multichannel active pattern 110_1 may be smaller than a fourth height H4 of the fourth portions P4 of the first multichannel active pattern 110_1. For example, the height to which the first multichannel active pattern 110_1 protrudes above the top surface of the first field insulating film 210, i.e., the first height H1, may be greater than the height to which the first multichannel active pattern 110_1 protrudes above the top surface of the second field insulating film 310, i.e., the third height H3.

The fifth portions P5 may have a fifth height H5 that is measured in the third direction Z from the level of the top surface of the first field insulating film 210 to the top surface of the second multichannel active pattern 110_2, and the sixth portions P6 may have a sixth height H6 that is measured in the third direction Z from the top surface of the substrate 100 to the level of the top surface of the first field insulating film 210. The seventh portions P7 may have a seventh height H7 that is measured in the third direction Z from the level of the top surface of the second field insulating film 310 to the top surface of the second multichannel active pattern 110_2, and the eighth portions P8 may have an eighth height H8 in the third direction Z that is measured from the top surface of the substrate 100 to the level of the top surface of the second field insulating film 310.

In some exemplary embodiments, a fifth height H5 of the fifth portions P5 of the second multichannel active pattern 110_2 may be greater than a seventh height H7 of the seventh portions P7 of the second multichannel active pattern 110_2. For example, a sixth height H6 of the sixth portions P6 of the second multichannel active pattern 110_2 may be smaller than an eighth height H8 of the eighth portions P8 of the second multichannel active pattern 110_2.

In some example embodiments, the first height H1 may be the same as the fifth height H5, and the third height H3 may be the same as the seventh height H7. However, the present disclosure is not limited to these example embodiments. As used herein, the expression "two elements being the same in a particular aspect" not only means that the two elements are identical in the particular aspect (e.g., orientation, layout, location, shape, size, amount, or other measure), but is also intended to encompass slight differences in the particular aspect between the two elements, caused by, for example, manufacturing processing margins. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. For example, the first height H1 of the first portions P1 of the first multichannel active pattern 110_1 may be substantially equal to the fifth height H5 of the fifth portions P5 of the second multichannel active pattern 110_2, and the second height H2 of the second portions P2 of the first multichannel active pattern 110_1 may be substantially equal to the sixth height H6 of the sixth portions P6 of the second multichannel active pattern 110_2.

In some embodiments, the height to which the second multichannel active pattern 110_2 protrudes above the top surface of the first field insulating film 210, i.e., the fifth height H5, may be greater than the height to which the second multichannel active pattern 110_2 protrudes above the top surface of the second field insulating film 310, i.e., the eighth height H8. Here, the top surfaces of the first and second field insulating films 210 and 310 may include portions that are in contact with the first and second multichannel active patterns 110_1 and 110_2.

In some example embodiments, a first thickness T1 of the field insulating film 210 may be smaller than a second thickness T2 of the second field insulating film 310.

In some example embodiments, the first multichannel active pattern 110_1 may include a first channel in the first region R1 and a second channel in the second region R2. In some example embodiments, the second multichannel active pattern 110_2 may include a third channel in the first region R1 and a fourth channel in the second region R2. In some example embodiments, the effective channel width of the first channel may be greater than the effective channel width of the second channel, and the effective channel width of the third channel may be greater than the effective channel width of the fourth channel.

Specifically, the first, second, third, and fourth channels may have first, second, third, and fourth widths W1, W2, W3, and W4, respectively. In some example embodiments, the first and second widths W1 and W2 may be substantially equal to one another, and the third and fourth widths W3 and W4 may be substantially equal to one another. In some example embodiments, the first, second, third, and fourth widths W1, W2, W3, and W4 may all be the same. Here, as already mentioned above, the expression "two elements being the same in a particular aspect" not only means that the two elements are identical in the particular aspect (e.g., orientation, layout, location, shape, size, amount, or other measure), but is also intended to encompass slight differences in the particular aspect between the two elements, caused by, for example, processing margins.

The first, second, third, and fourth channels may have the first, third, fifth, and seventh heights H1, H3, H5, and H7, respectively. As already mentioned above, the first height H1 may be greater than the third height H3, and the fifth height H5 may be greater than the seventh height H7. Since the first and second channels have the same width but have different heights, the first and second channels may have different effective channel widths. The third and fourth channels may also have different effective channel widths. For example, the first multichannel active pattern 110_1 may include first and second channels having different effective channel widths, and the second multichannel active pattern 110_2 may include third and fourth channels having different effective channel widths.

In some example embodiments, each of the multichannel active patterns 110 may include fourth and fifth trenches TR_4 and TR_5, which are spaced apart in the first direction X. The fourth and fifth trenches TR_4 and TR_5 may extend in the second direction Y. In some example embodiments, the first epitaxial pattern 410 may fill the fourth and fifth trenches TR_4 and TR_5. FIG. 4 illustrates the uppermost surface of the first epitaxial pattern 410 as being higher than the lowermost surface of the first gate structure 120, but the present disclosure is not limited. For example, the uppermost surface of the first epitaxial pattern 410 may exist on the same plane as the lowermost surface of the first gate structure 120.

FIG. 4 shows a cross-sectional view, taken along the first direction X, of a part in the first region R1 where the first multichannel active pattern 110_1 and the first gate structure 120 cross each other, but the present disclosure is not limited. In some embodiments, a part in the first region R1 where the second multichannel active pattern 110_2 and the first gate structure 120 cross each other may have a similar structure to that illustrated in FIG. 4, and a part in the second region R2 where the first or second multichannel active pattern 110_1 or 110_2 and the second gate structure 130 cross each other may also have a similar structure to that illustrated in FIG. 4. For example, the first multichannel active pattern 110_1 may include a first region R1 in which the first multichannel active pattern 110_1 and the first gate structure 120 overlap in the Z direction and a second region R2 in which the first multichannel active pattern 110_1 and the second gate structure 130 overlap in the Z direction.

In some example embodiments, in the first region R1, the semiconductor device according to some example embodiments of the present disclosure may include the first and second epitaxial patterns 410 and 412. In some example embodiments, in the second region R2, the semiconductor device according to some example embodiments of the present disclosure may include the third and fourth epitaxial patterns 610 and 612.

In some example embodiments, the height in the Z direction of the first and second epitaxial patterns 410 and 412 from the top surface of the substrate 100 to the top surface of the first field insulating film 210, i.e., a ninth height H9, may be smaller than the height of the third and fourth epitaxial patterns 610 and 612 from the top surface of the substrate 100 to the top surface of the second field insulating film 310, i.e., a tenth height H10.

In a case where the semiconductor device according to some example embodiments of the present disclosure is a p-type metal oxide semiconductor (PMOS) transistor, each of the first, second, third, and fourth epitaxial patterns 410, 412, 610, and 612 may include p-type impurities or impurities for preventing the diffusion of p-type impurities. For example, the first, second, third, and fourth epitaxial patterns 410, 412, 610, and 612 may comprise at least one of B, C, In, Ga, Al, and a combination thereof.

In a case where the semiconductor device according to some example embodiments of the present disclosure is a PMOS transistor, each of the first, second, third, and fourth epitaxial patterns 410, 412, 610, and 612 may comprise a compressive stress material. For example, in a case where each of the multichannel active patterns 110 comprises Si, each of the first, second, third, and fourth epitaxial patterns 410, 412, 610, and 612 may comprise a material having a greater lattice constant than Si, such as SiGe. The compressive stress material can improve the mobility of carriers in each channel region by applying compressive stress to the multichannel active patterns 110.

In a case where the semiconductor device according to some example embodiments of the present disclosure is a n-type metal oxide semiconductor (NMOS) transistor, each of the first, second, third, and fourth epitaxial patterns 410, 412, 610, and 612 may include n-type impurities or impurities for preventing the diffusion of n-type impurities. For example, the first, second, third, and fourth epitaxial patterns 410, 412, 610, and 612 may comprise at least one of P, Sb, As, and a combination thereof.

In a case where the semiconductor device according to some example embodiments of the present disclosure is an NMOS transistor, each of the first, second, third, and fourth epitaxial patterns 410, 412, 610, and 612 may comprise a tensile stress material. For example, in a case where each of the multichannel active patterns 110 comprises Si, each of the first, second, third, and fourth epitaxial patterns 410, 412, 610, and 612 may comprise a material having a smaller lattice constant than Si, such as SiC. The tensile stress material can improve the mobility of carriers in each channel region by applying tensile stress to the multichannel active patterns 110.

FIGS. 5 and 6 illustrate the first, second, third, and fourth epitaxial patterns 410, 412, 610, and 612 as having a pentagonal shape, but the present disclosure is not limited. FIGS. 5 and 6 illustrate the first and second epitaxial patterns 410 and 412 as being in contact with each other, but the present disclosure is not limited. For example, the first and second epitaxial patterns 410 and 412 may be separated from one another. Also, FIGS. 5 and 6 illustrate the third and fourth epitaxial patterns 610 and 612 as being in contact with each other, but the present disclosure is not limited. For example, the third and fourth epitaxial patterns 610 and 612 may be separated from one another. Also, FIGS. 5 and 6 illustrate the first, second, third, and fourth epitaxial patterns 410, 412, 610, and 612 as being single-layer films, but the present disclosure is not limited. For example, each of the first, second, third, and fourth epitaxial patterns 410, 412, 610, and 612 may be multilayer films.

A semiconductor device according to some example embodiments of the present disclosure will hereinafter be described with reference to FIGS. 7 and 8. For convenience, descriptions of elements or features that have already been described above will be omitted or at least simplified.

Figure 8:
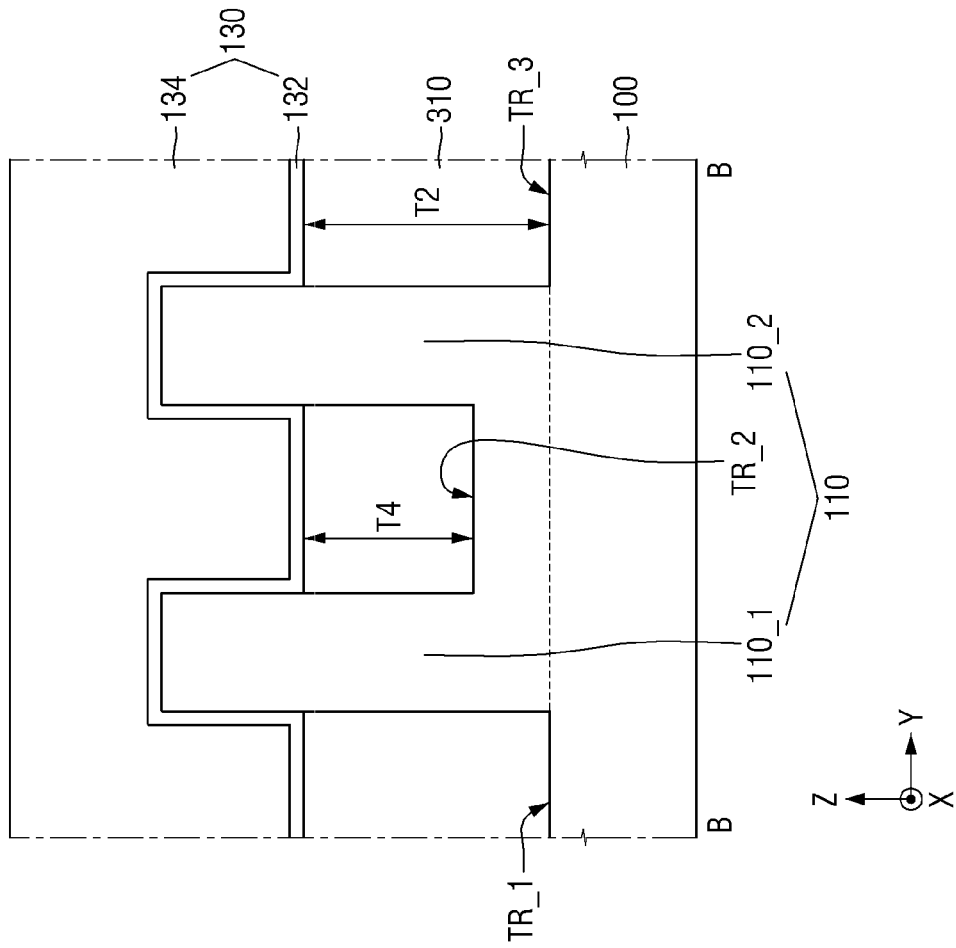
Figure 9:
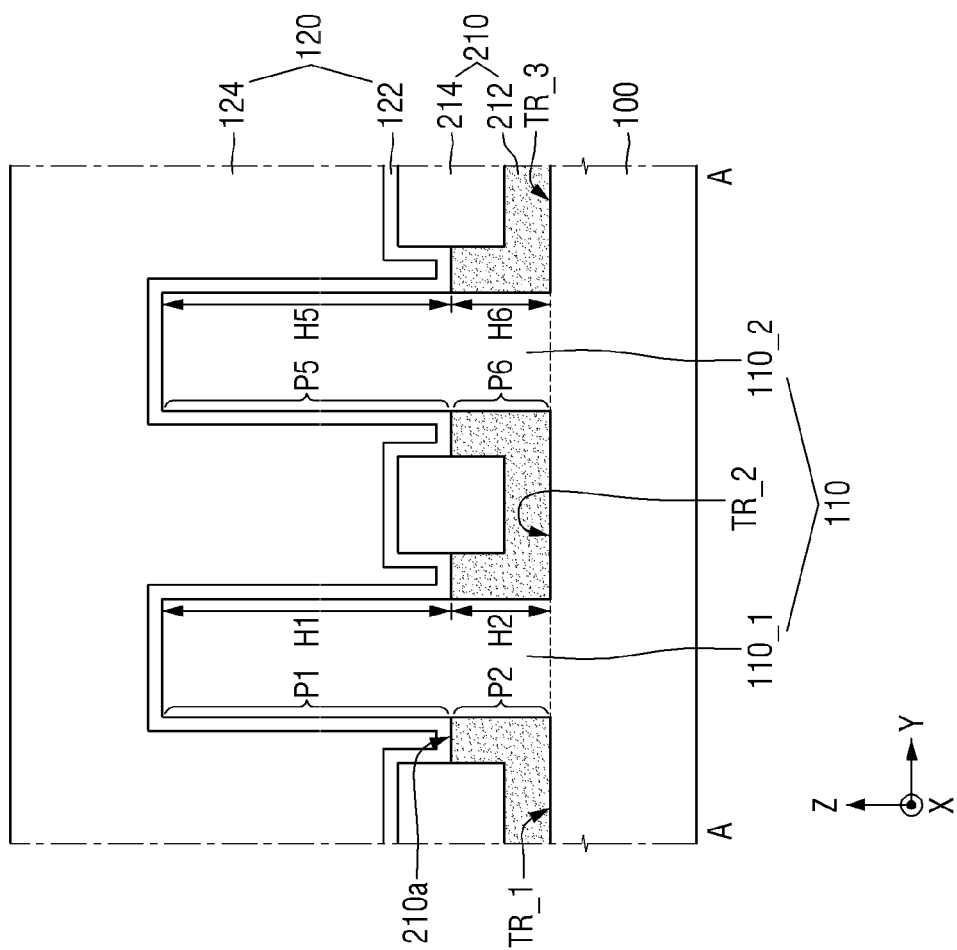

Referring to FIGS. 7 and 8, in some example embodiments, a depth D1 of a first trench TR_1 may be greater than a depth D2 of a second trench TR_2, and a depth D3 of a third trench TR_3 may be greater than the depth D2 of the second trench TR_2.

In some example embodiments, a first thickness T1 of a first field insulating film 210 filling a first trench TR_1 in a first region R1 may be smaller than a second thickness T2 of a second field insulating film 310 filling a first trench TR_1 in a second region R2, and a third thickness T3 of the first field insulating film 210 filling a second trench TR_2 in the first region R1 may be smaller than a fourth thickness T4 of the second field insulating film 310 filling a second trench TR_2 in the second region R2.

A semiconductor device according to some example embodiments of the present disclosure will hereinafter be described with reference to FIGS. 1, 9, and 10. For convenience, descriptions of elements or features that have already been described above will be omitted or at least simplified.

Figure 10:
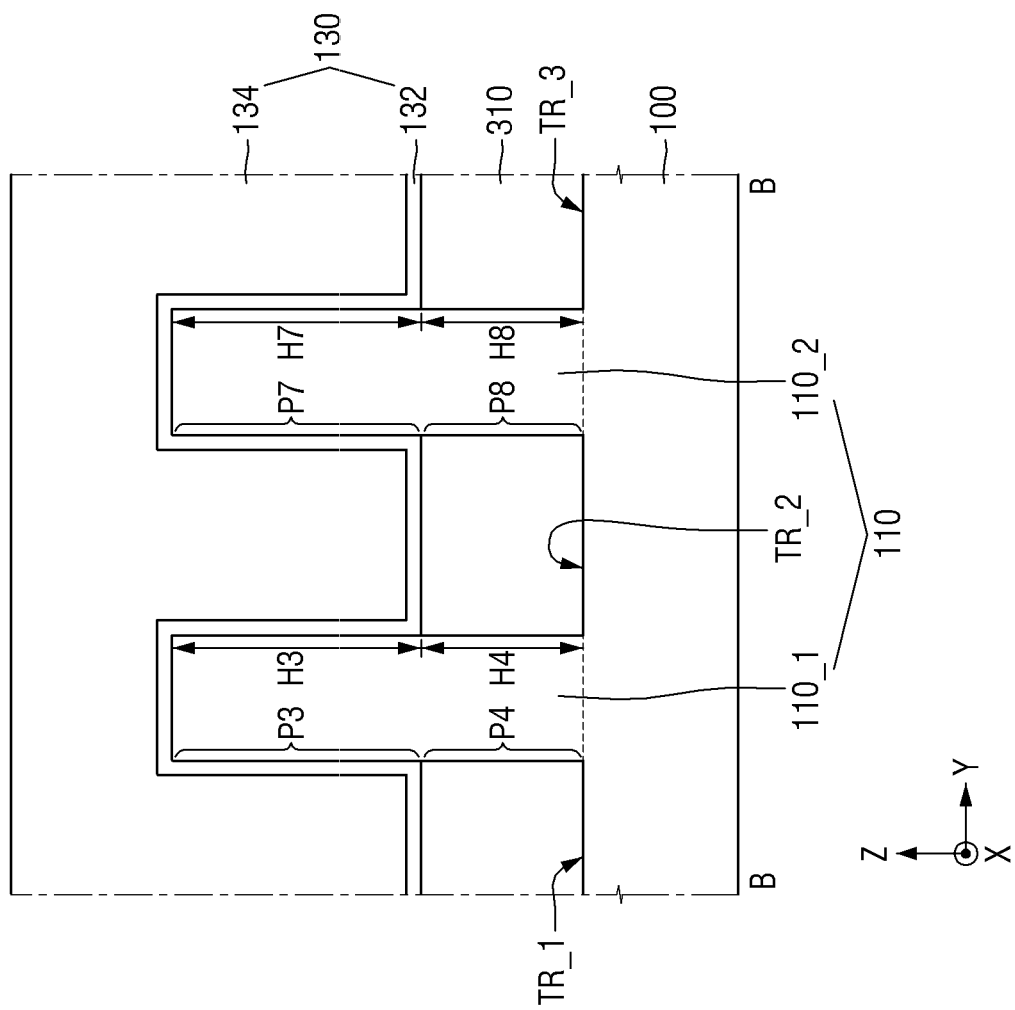

Referring to FIGS. 1, 9, and 10, in a first region R1, the semiconductor device according to some example embodiments of the present disclosure may include a substrate 100, first and second multichannel active patterns 110_1 and 110_2, the first field insulating film 210, and a first gate structure 120. In a second region R2, the semiconductor device according to some example embodiments of the present disclosure may include the substrate 100, the first and second multichannel active patterns 110_1 and 110_2, a second field insulating film 310, and a second gate structure 130.

The first and second multichannel active patterns 110_1 and 110_2 may be formed from etching the semiconductor substrate 100 or may be formed by epitaxial growth in trenches in an isolation dielectric. In some embodiments, the first and second multichannel active patterns 110_1 and 110_2 may be formed simultaneously with the same process.

In some example embodiments, a first field insulating film 210 may be a multilayer film. For example, the first field insulating film 210 may include the first insulating liner 212 and the first filling insulating film 214. The first insulating liner 212 may be formed on the substrate 100. The first insulating liner 212 may also be formed on parts of the sidewalls of each of the first and second multichannel active patterns 110_1 and 110_2. For example, the first insulating liner 212 may be formed along the top surface of the substrate 100 to cover parts of the sidewalls of the first and second multichannel active patterns 110_1 and 110_2. Specifically, in the first region R1, the first insulating liner 212 may fill parts of first, second, and third trenches TR_1, TR_2, and TR_3.

The first filling insulating film 214 may be formed on the first insulating liner 212. In some example embodiments, the first filling insulating film 214 may include portions that protrude above the uppermost surface of the first insulating liner 212. For example, a top surface of the first filling insulating film 214 may be at a higher level than the uppermost surface of the first insulating liner 212. In some embodiments, in the first region R1, the semiconductor device according to some example embodiments of the present disclosure may have an area where the first insulating liner 212 does not exist between the first filling insulating film 214 and the sidewalls of each of the first and second multichannel active patterns 110_1 and 110_2.

In some example embodiments, the first insulating liner 212 may comprise an insulating material. Also, the first insulating liner 212 may comprise a material having etching selectivity with respect to the first filling insulating film 214. For example, during the etching of the first field insulating film 210, the rate at which the first insulating liner 212 is etched may differ from the rate at which the first filling insulating film 214 is etched. For example, during the etching of the first field insulating film 210, the first insulating liner 212 may be etched faster than the first filling insulating film 214.

In the first region R1, the first gate structure 120 may be formed on the sidewalls of each of the first and second multichannel active patterns 110_1 and 110_2 and on the first field insulating film 210. Specifically, in the first region R1, the first gate insulating film 122 may be formed along the profile of the top surface and parts of the sidewalls of each of the first and second multichannel active patterns 110_1 and 110_2. The first gate electrode 124 may be formed on the first gate insulating film 122. In some embodiments, the first gate electrode 124 may fill a space between the first and second multichannel active patterns 110_1 and 110_2.

In some example embodiments, a first height H1 of first portions P1 of the first multichannel active pattern 110_1 may be greater than a third height H3 of third portions P3 of the first multichannel active pattern 110_1, and a second height H2 of second portions P2 of the first multichannel active pattern 110_1 may be smaller than a fourth height H4 of fourth portions P4 of the first multichannel active pattern 110_1. For example, the height to which the first multichannel active pattern 110_1 protrudes above a top surface 210a of the first field insulating film 210, i.e., the first height H1, may be greater than the height to which the first multichannel active pattern 110_1 protrudes above the top surface of the second field insulating film 310, i.e., the third height H3. As already mentioned above, the top surface 210a of the first field insulating film 210 may be defined as a part of the top surface of the first field insulating film 210 adjacent to each of the first and second multichannel active patterns 110_1 and 110_2.

Although not specifically illustrated, in some example embodiments, the first trench TR_1 may be deeper than the second trench TR_2, the third trench TR_3 may be deeper than the second trench TR_2, and the first trench TR_1 may be the same depth as the third trench TR_3, however the present disclosure is not limited thereto. For example, TR_1 may be deeper than the second trench TR_2, and the height of the second trench TR_2 may be substantially equal to the height of the third trench TR_3. In another example, TR_1 may be deeper than the second trench TR_2, the third trench TR_3 may be deeper than the second trench TR_2, and the first trench TR_1 may be the different depth from the third trench TR_3.

A semiconductor device according to some example embodiments of the present disclosure will hereinafter be described with reference to FIGS. 1, 9, and 11. For convenience, descriptions of elements or features that have already been described above will be omitted or at least simplified.

Figure 11:
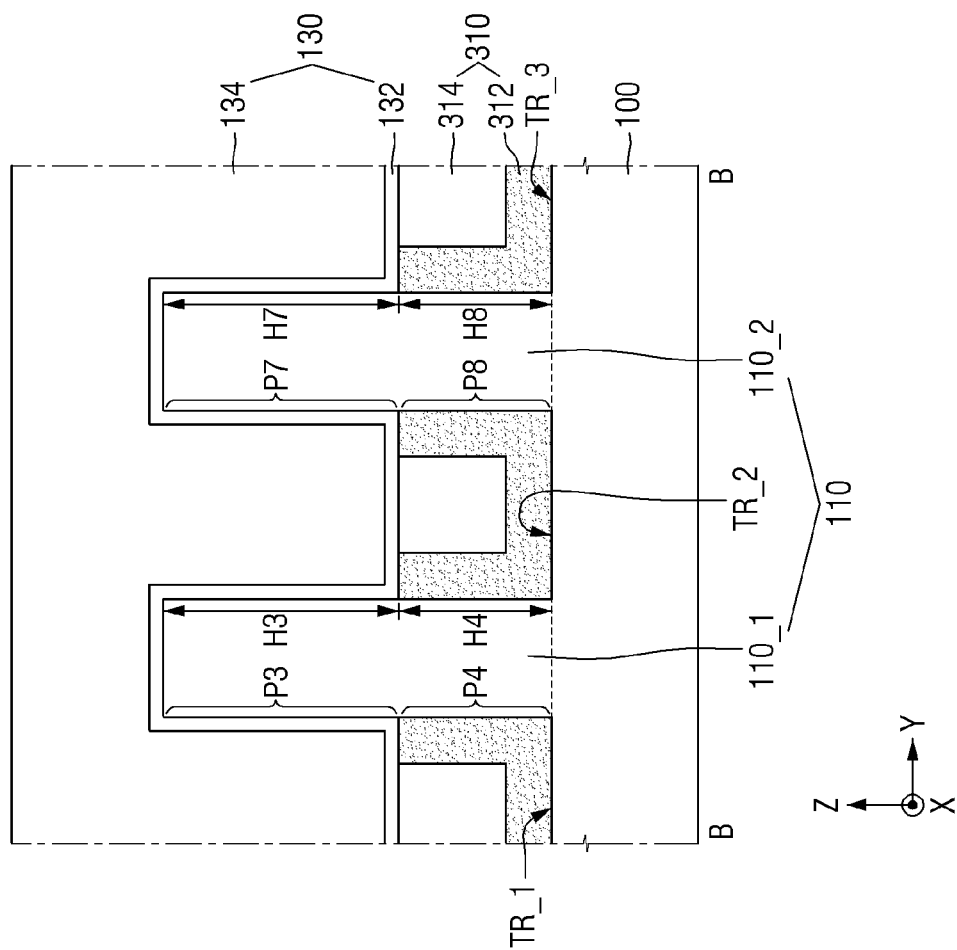

Referring to FIGS. 1, 9, and 11, in a first region R1, the semiconductor device according to some example embodiments of the present disclosure may include a substrate 100, first and second multichannel active patterns 110_1 and 110_2, a first insulating liner 212, a first filling insulating film 214, and a first gate structure 120. In a second region R2, the semiconductor device according to some example embodiments of the present disclosure may include the substrate 100, the first and second multichannel active patterns 110_1 and 110_2, a second insulating liner 312, a second field insulating film 314, and a second gate structure 130.

In some example embodiments, a second field insulating film 310 may include the second insulating liner 312 and the second filling insulating film 314. The second insulating liner 312 may be formed on parts of the sidewalls of each of the first and second multichannel active patterns 110_1 and 110_2 and on the substrate 100. In some embodiments, the second insulating liner 312 may be formed along the profile of the top surface of the substrate 100 and the profile of parts of the sidewalls of each of the first and second multichannel active patterns 110_1 and 110_2. For example, the second insulating liner 312 may be formed to surround parts of the multichannel active patterns 110. Specifically, in the second region R2, the second insulating liner 312 may fill parts of first, second, and third trenches TR_1, TR_2, and TR_3.

In some example embodiments, the second filling insulating film 314 may be formed on the second insulating liner 312. The uppermost surface of the second insulating liner 312 may exist on the same plane as the uppermost surface of the second filling insulating film 314.

In some example embodiments, the first and second insulating liners 212 and 312 may comprise the same material, and the first and second filling insulating films 214 and 314 may comprise the same material. Here, as already mentioned above, the expression "two elements comprising the same material" means that the two elements are formed by the same process.

Although not specifically illustrated, in some example embodiments, the first trench TR_1 may be deeper than the second trench TR_2, the third trench TR_3 may be deeper than the second trench TR_2, and the first trench TR_1 may have the same depth as the third trench TR_3.

A semiconductor device according to some example embodiments of the present disclosure will hereinafter be described with reference to FIGS. 1, 2, and 12. For convenience, descriptions of elements or features that have already been described above will be omitted or at least simplified.

Figure 12:
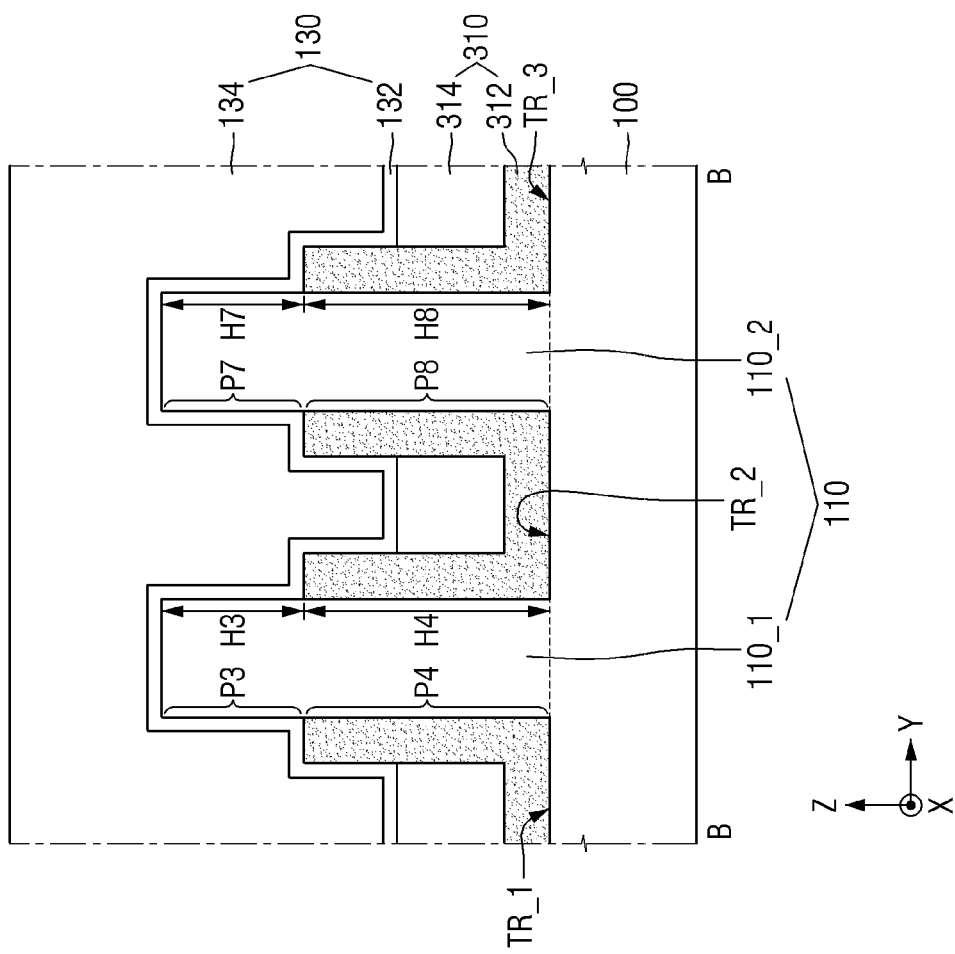

Referring to FIGS. 1, 2, and 12, in a first region R1, the semiconductor device according to some example embodiments of the present disclosure may include a substrate 100, first and second multichannel active patterns 110_1 and 110_2, a first field insulating film 210, and a first gate structure 120. In a second region R2, the semiconductor device according to some example embodiments of the present disclosure may include the substrate 100, the first and second multichannel active patterns 110_1 and 110_2, a second field insulating film 310, and a second gate structure 130.

In some example embodiments, the second field insulating film 310 may include the second insulating liner 312 and the second filling insulating film 314. The second insulating liner 312 may be formed on parts of the sidewalls of each of the first and second multichannel active patterns 110_1 and 110_2 and on the substrate 100. For example, the second insulating liner 312 may be formed along the profile of the top surface of the substrate 100 and the profile of parts of the sidewalls of each of the first and second multichannel active patterns 110_1 and 110_2. For example, in the first region R1, the second insulating liner 312 may fill parts of the first, second, and third trenches TR_1, TR_2, and TR_3. The second filling insulating film 314 may be formed on the second insulating liner 312. The uppermost surface of the second filling insulating film 314 may be lower than the uppermost surface of the second insulating liner 312. For example, the second insulating liner 312 may protrude above the second filling insulating film 314 and may have portions in contact with the sidewalls of each of the first and second multichannel active patterns 110_1 and 110_2.

Although not specifically illustrated, in some example embodiments, the first trench TR_1 may be deeper than the second trench TR_2, the third trench TR_3 may be deeper than the second trench TR_2, and the first trench TR_1 may have the same depth as the third trench TR_3.

A semiconductor device according to some example embodiments of the present disclosure will hereinafter be described with reference to FIGS. 1, 2, and 13. For convenience, descriptions of elements or features that have already been described above will be omitted or at least simplified.

Figure 13:
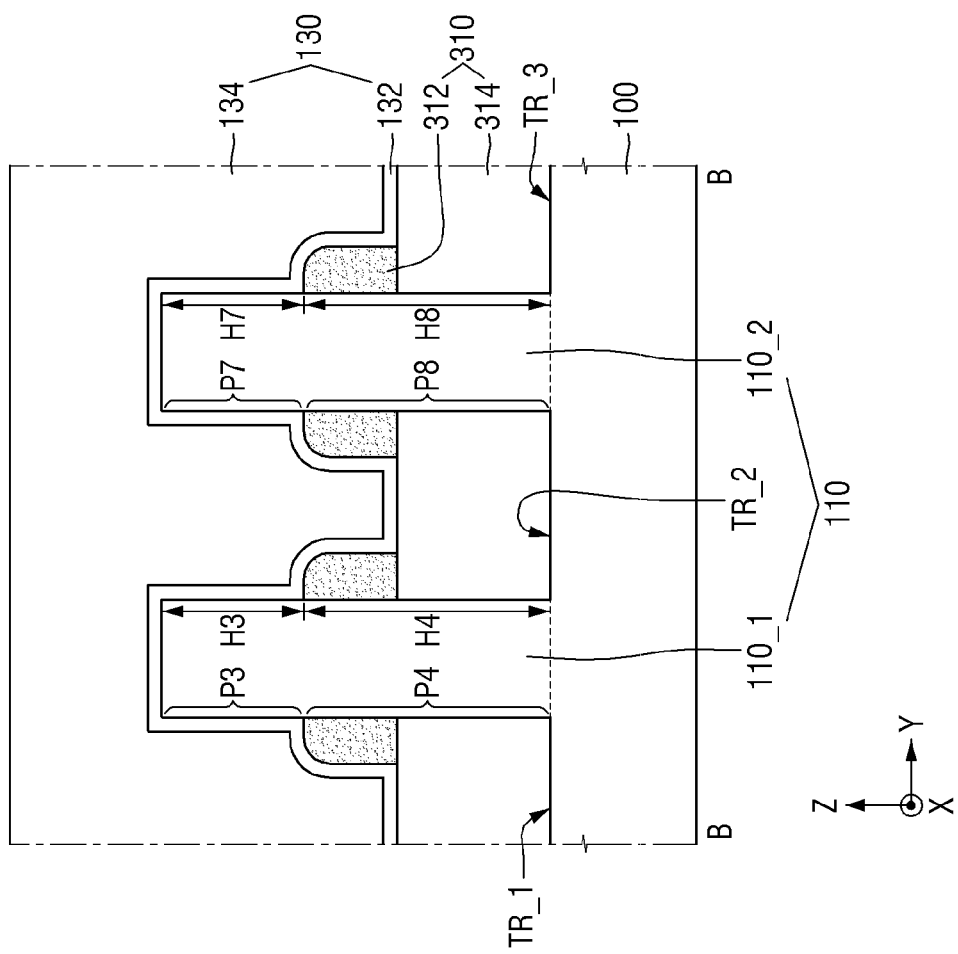

Referring to FIGS. 1, 2, and 13, in a first region R1, the semiconductor device according to some example embodiments of the present disclosure may include a substrate 100, first and second multichannel active patterns 110_1 and 110_2, a first field insulating film 210, and a first gate structure 120. In a second region R2, the semiconductor device according to some example embodiments of the present disclosure may include the substrate 100, the first and second multichannel active patterns 110_1 and 110_2, a second field insulating film 310, and a second gate structure 130.

In some example embodiments, a second field insulating film 310 may include the second insulating liner 312 and the second filling insulating film 314. The second filling insulating film 314 may fill portions of the first trench TR_1, the second trench TR_2, and the third trench TR_3. In some embodiments, top surfaces of the second insulating film 314 in the first trench TR_1, the second trench TR_2, and the third trench TR_3 may be at the same level. The second insulating liner 312 may be formed on the second filling insulating film 314 to be in contact with the sidewalls of each of the first and second multichannel active patterns 110_1 and 110_2. Accordingly, the uppermost surface of the second insulating liner 312 may be higher than the uppermost surface of the second filling insulating film 314.

Although not specifically illustrated, in some example embodiments, a first trench TR_1 may be deeper than a second trench TR_2, a third trench TR_3 may be deeper than the second trench TR_2, and the first trench TR_1 may have the same depth as the third trench TR_3.

A semiconductor device according to some example embodiments of the present disclosure will hereinafter be described with reference to FIGS. 1, 2, and 14. For convenience, descriptions of elements or features that have already been described above will be omitted or at least simplified.

Figure 14:
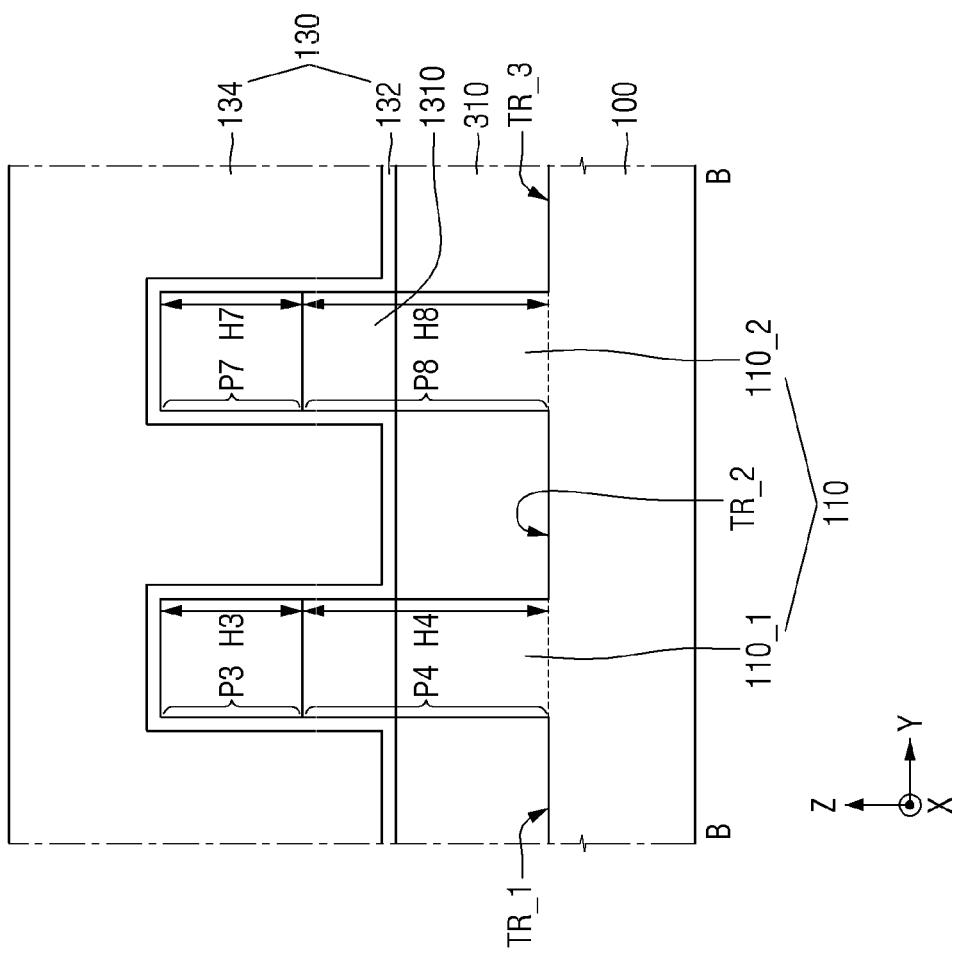

Referring to FIGS. 1, 2, and 14, in a first region R1, the semiconductor device according to some example embodiments of the present disclosure may include a substrate 100, first and second multichannel active patterns 110_1 and 110_2, a first field insulating film 210, and a first gate structure 120. In a second region R2, the semiconductor device according to some example embodiments of the present disclosure may include the substrate 100, the first and second multichannel active patterns 110_1 and 110_2, first insulating patterns 1310, a second field insulating film 310, and a second gate structure 130.

In some example embodiments, the first and second multichannel active patterns 110_1 and 110_2 may include the first insulating patterns 1310. The uppermost surfaces of the first insulating patterns 1310 may be higher than the uppermost surface of the second field insulating film 310. For example, the first insulating patterns 1310 may protrude above the second field insulating film 310. The first insulating patterns 1310 may comprise an electric insulating material. Accordingly, no channels may be formed in the first insulating patterns 1310. The first insulating patterns 1310 may comprise, for example, $SiO_2$, but the present disclosure is not limited.

The third height H3 may be the height from the top surface of the first insulating patterns 1310 to the top surface of the first multichannel active pattern 110_1, and the seventh height H7 may be the height from the top surface of the first insulating patterns 1310 to the top surface of the second multichannel active pattern 110_2. The fourth height H4 may be the height from the top surface of the substrate 100 to the top surface of the first insulating patterns 1310 of the first multichannel active pattern 110_1, and the eighth height H8 may be the height from the top surface of the substrate 100 to the top surface of the first insulating patterns 1310 of the second multichannel active pattern 110_2. The third height H3 and the seventh height H7 may be the same, and the fourth height H4 and the eighth height H8 may be the same.

Although not specifically illustrated, in some example embodiments, a first trench TR_1 may be deeper than a second trench TR_2, a third trench TR_3 may be deeper than the second trench TR_2, and the first trench TR_1 may have the same depth as the third trench TR_3.

A semiconductor device according to some example embodiments of the present disclosure will hereinafter be described with reference to FIGS. 1, 2, and 15. For convenience, descriptions of elements or features that have already been described above will be omitted or at least simplified.

Figure 15:
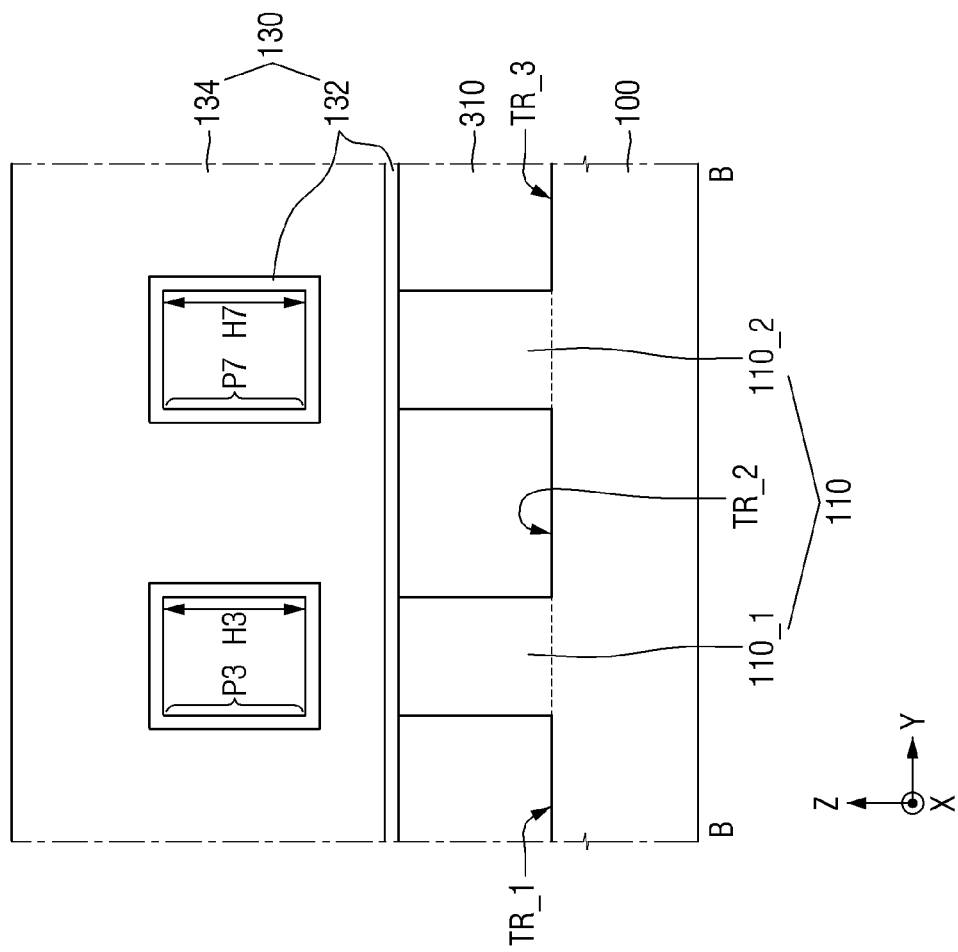

Referring to FIGS. 1, 2, and 15, in a first region R1, the semiconductor device according to some example embodiments of the present disclosure may include a substrate 100, first and second multichannel active patterns 110_1 and 110_2, a first field insulating film 210, and a first gate structure 120. In a second region R2, the semiconductor device according to some example embodiments of the present disclosure may include the substrate 100, the first and second multichannel active patterns 110_1 and 110_2, a second field insulating film 310, and a second gate structure 130.

In some example embodiments, each of the first and second multichannel active patterns 110_1 and 110_2 may have a fin field-effect transistor (FinFET) structure in the first region R1 and a nanowire structure in the second region R2.

In some example embodiments, in the second region R2, the first multichannel active pattern 110_1 may include third portions P3 in contact with the second gate insulating film 132, and the second multichannel active pattern 110_2 may include seventh portions P7 in contact with the second gate insulating film 132. The second gate insulating film 132 may cover all the side surface and surround the third portions P3 and the seventh portions P7. Each of the third portions P3 may have a third height H3 that is a distance from a bottom surface of the third portion P3 to a top surface of the third portion P3, and each of the seventh portions P7 may have a seventh height H7 that is a distance from a bottom surface of the seventh portion P7 to a top surface of the seventh portion P7.

Although not specifically illustrated, in some example embodiments, a first trench TR_1 may be deeper than a second trench TR_2, a third trench TR_3 may be deeper than the second trench TR_2, and the first trench TR_1 may have the same depth as the third trench TR_3.

FIGS. 16 through 34 are cross-sectional views illustrating a method of fabricating a semiconductor device according to some example embodiments of the present disclosure. Specifically, FIGS. 16 through 34 show cross-sectional views of regions R1 and R2, taken along lines A-A and B-B of FIG. 1. For convenience, descriptions of elements or features that have already been described above will be omitted or at least simplified.

The methods of fabricating a semiconductor device according to some example embodiments of the present disclosure that will hereinafter be described are merely example, and the present disclosure is not limited. As such, one of ordinary skill in the art may add particular steps or modify the steps described herein without departing from the scope of the present disclosure.

A method of fabricating a semiconductor device according to some example embodiments of the present disclosure will hereinafter be described with reference to FIGS. 1 through 3, 7, 8, and 16 through 19.

A first hard mask 1610 may be formed on a substrate 100. First multichannel active patterns 110_1 and second multichannel active patterns 110_2 may be formed by etching the substrate 100 using the first hard mask 1610 as an etching mask. For example, first trenches TR_1, second trenches TR_2, and third trenches TR_3 may be formed using the first hard mask 1610 as an etching mask. However, the present disclosure is not limited to this. For example, the first multichannel active patterns 110_1 and the second multichannel active patterns 110_2 may be formed by growing an epitaxial material on the substrate 110.

Figure 17A:
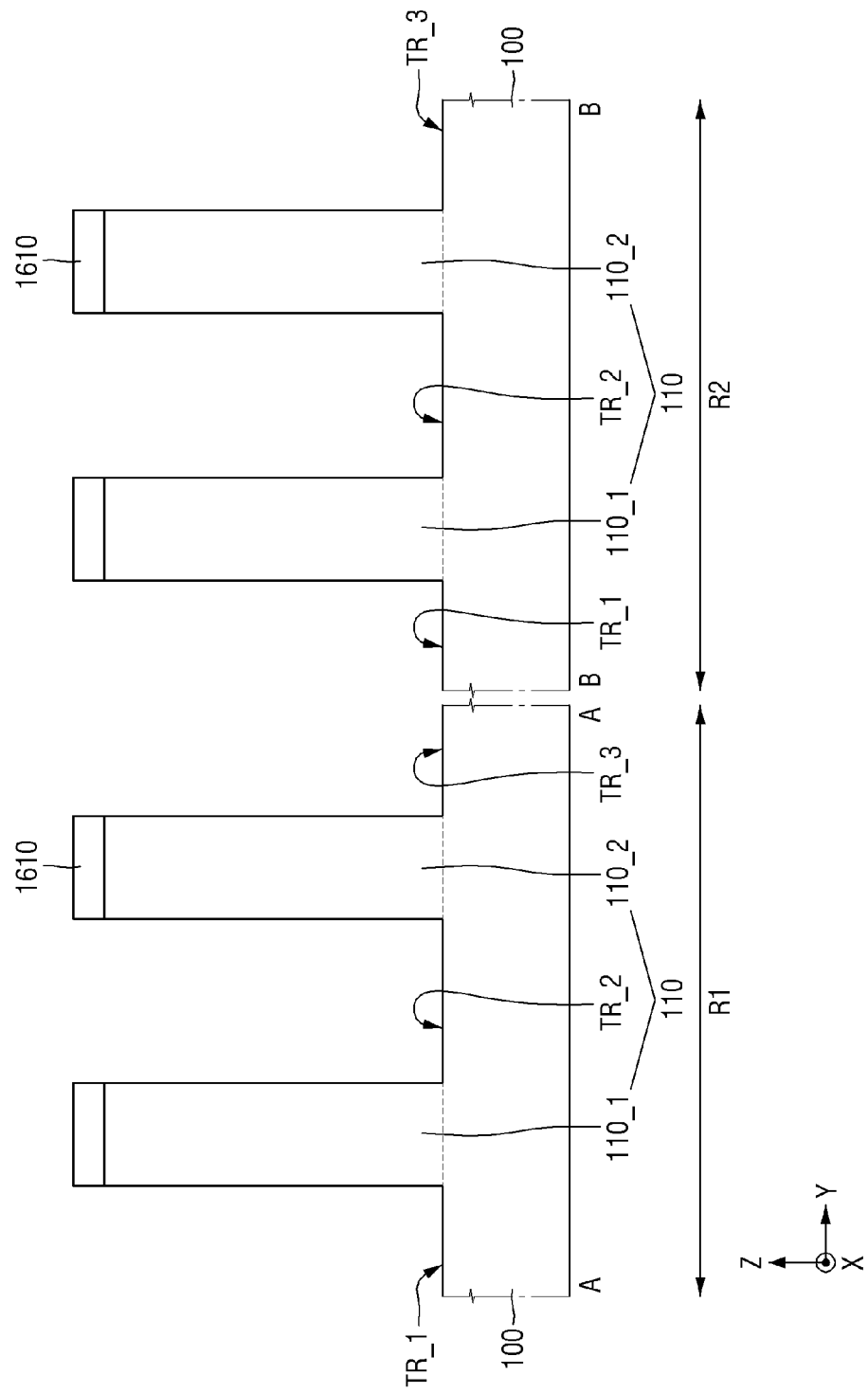
Figure 17B:
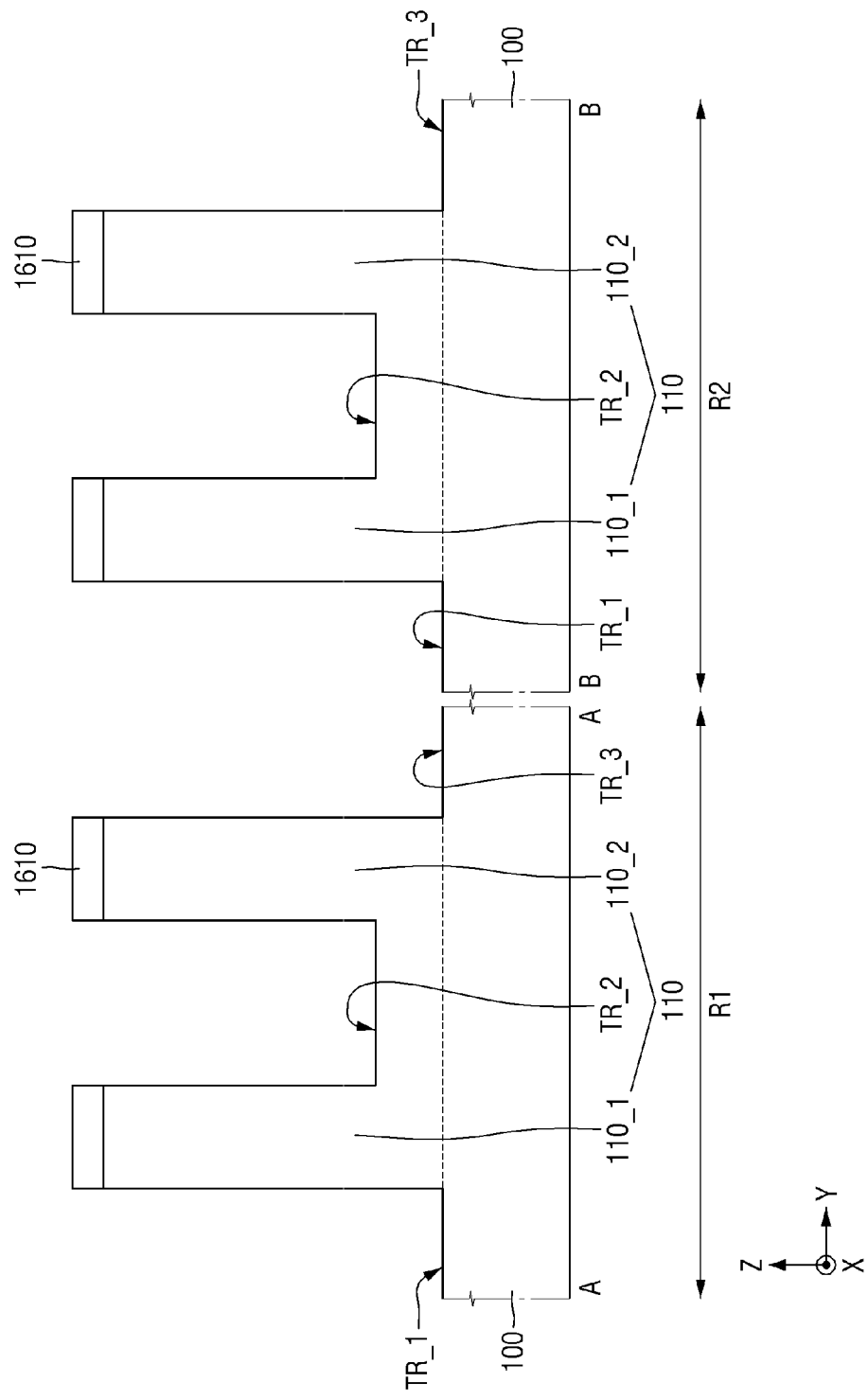

The first trenches TR_1, the second trenches TR_2, and the third trenches TR_3 may have the same depth (as illustrated in FIG. 17A), or may have different depths (as illustrated in FIG. 17B). Here, as already mentioned above, the expression "two elements being the same in a particular aspect" not only means that the two elements are identical in the particular aspect, but also means that there may be slight differences in the particular aspect between the two elements, caused by, for example, processing margins. In the description that follows, for convenience of description, it is assumed that the first trenches TR_1, the second trenches TR_2, and the third trenches TR_3 all have the same depth, but the present disclosure is not limited.

Figure 18:
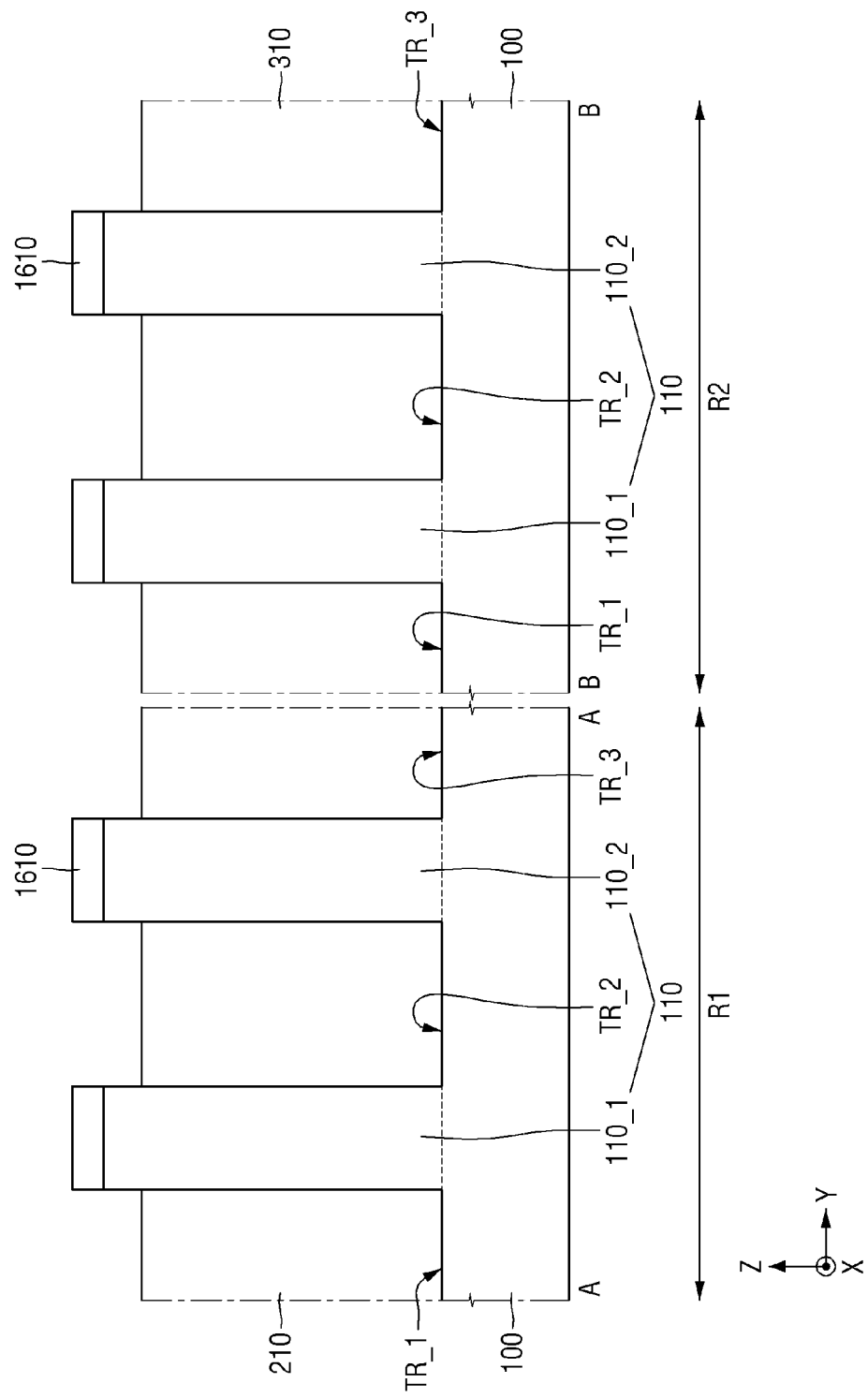
Figure 19:
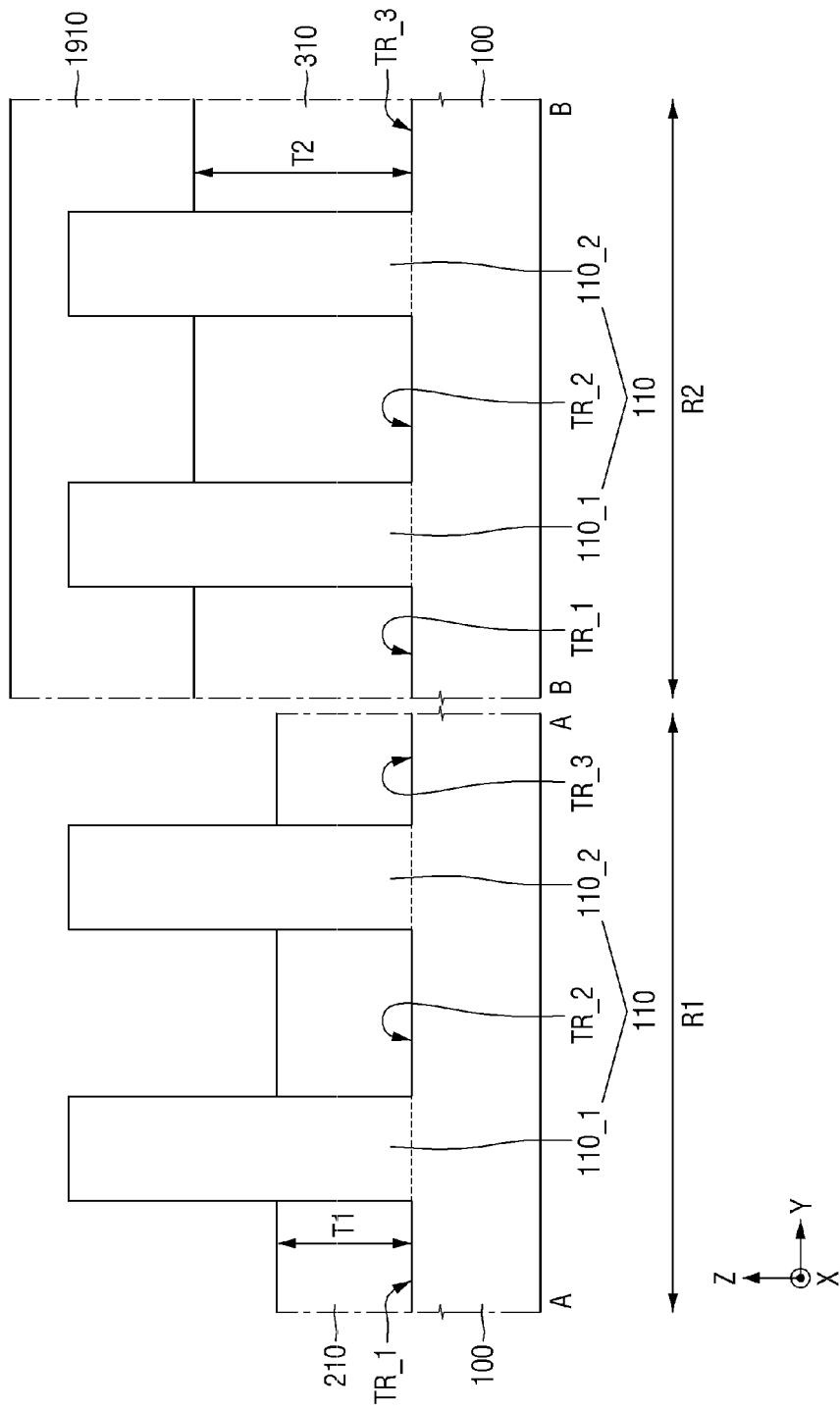
Figure 20:
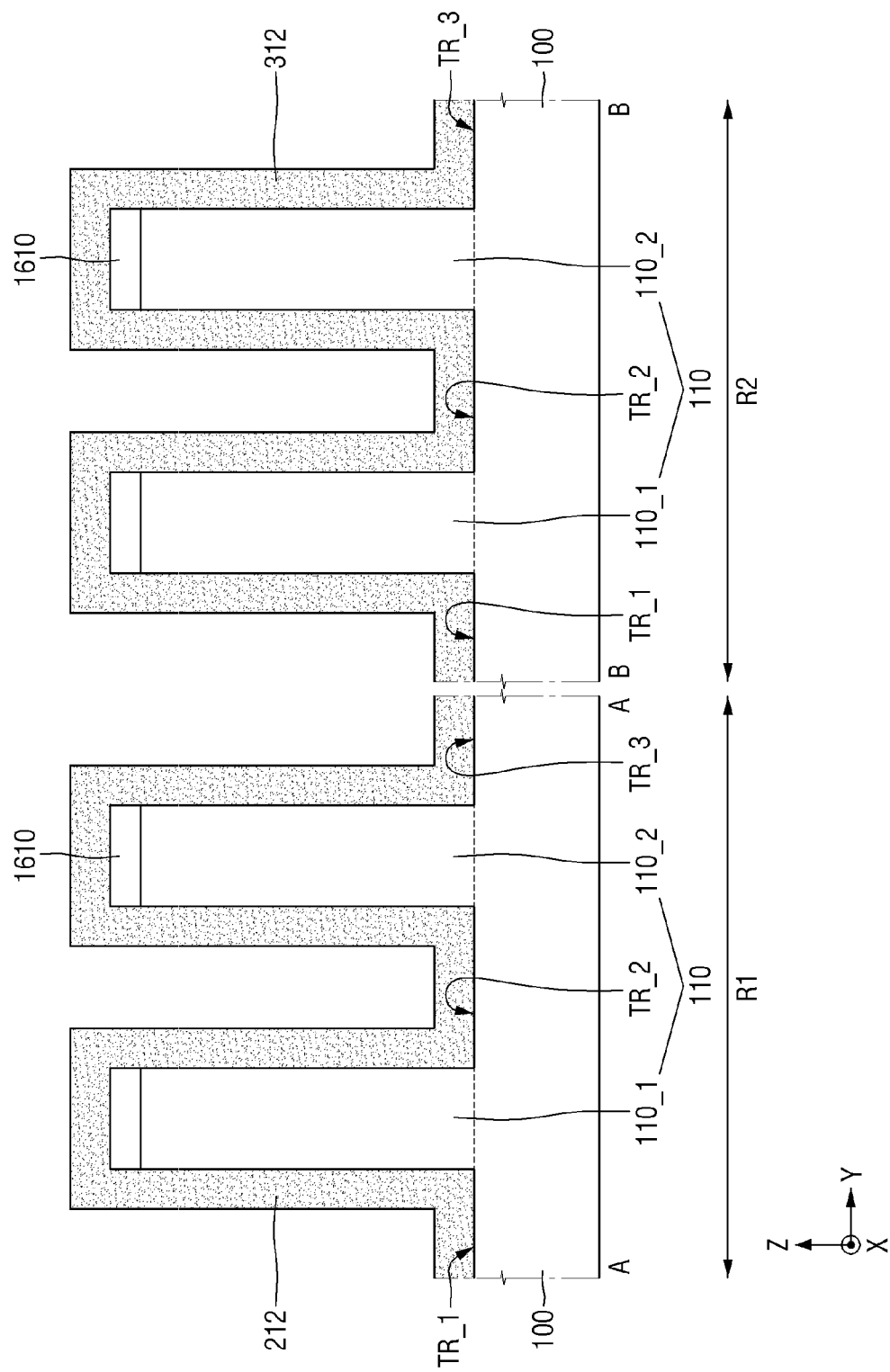
Figure 21:
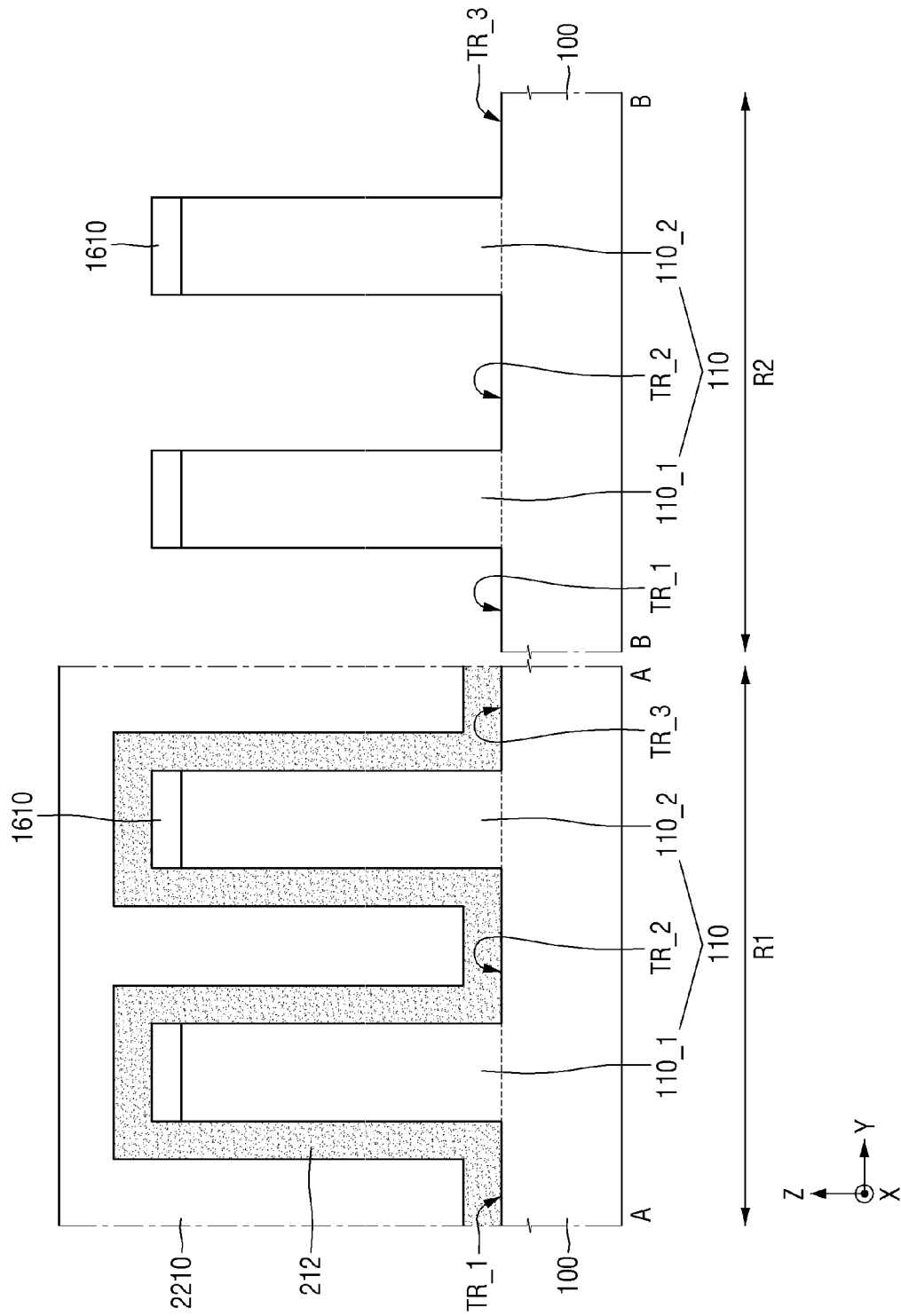
Figure 22A:
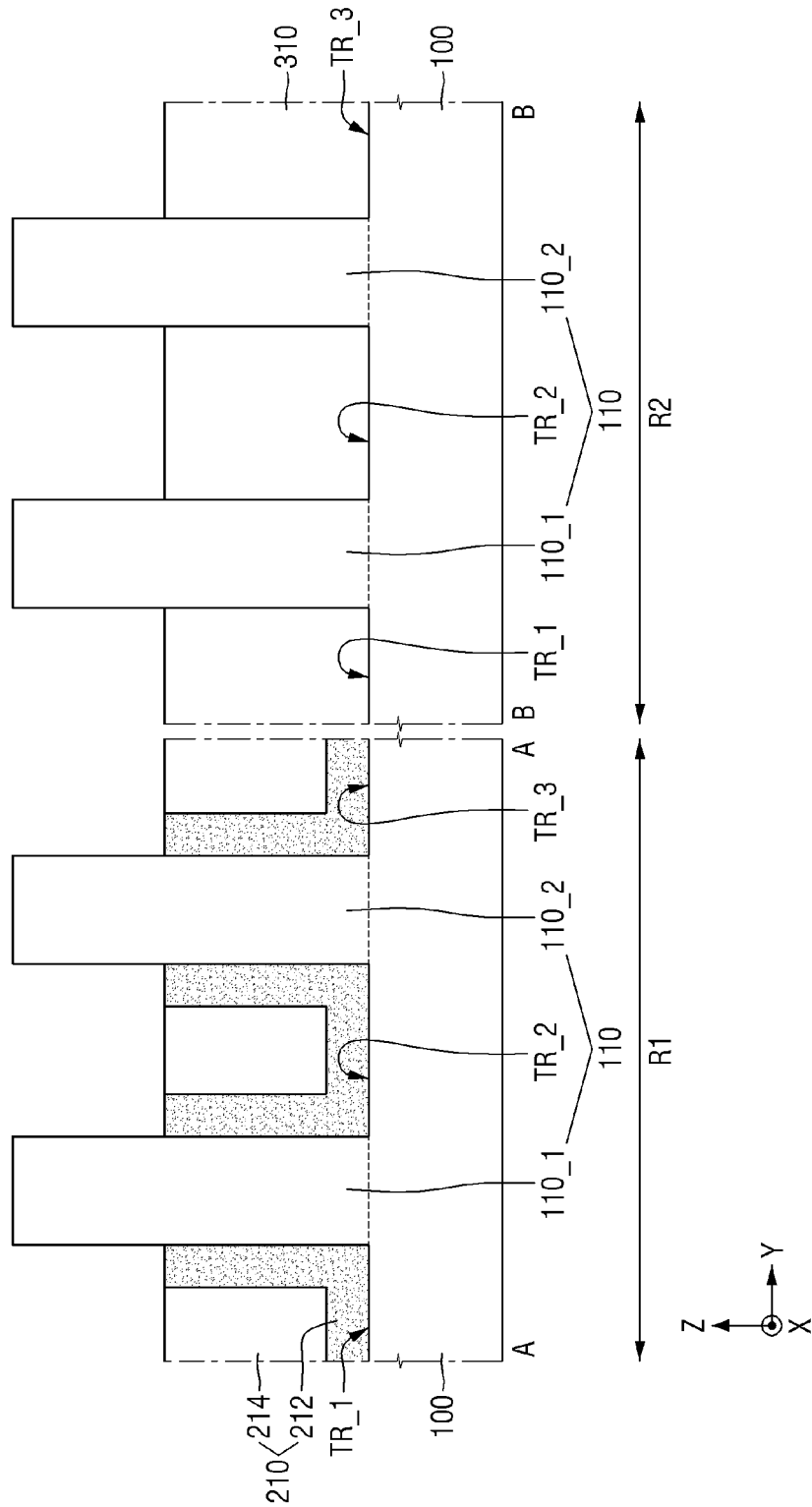
Figure 22B:
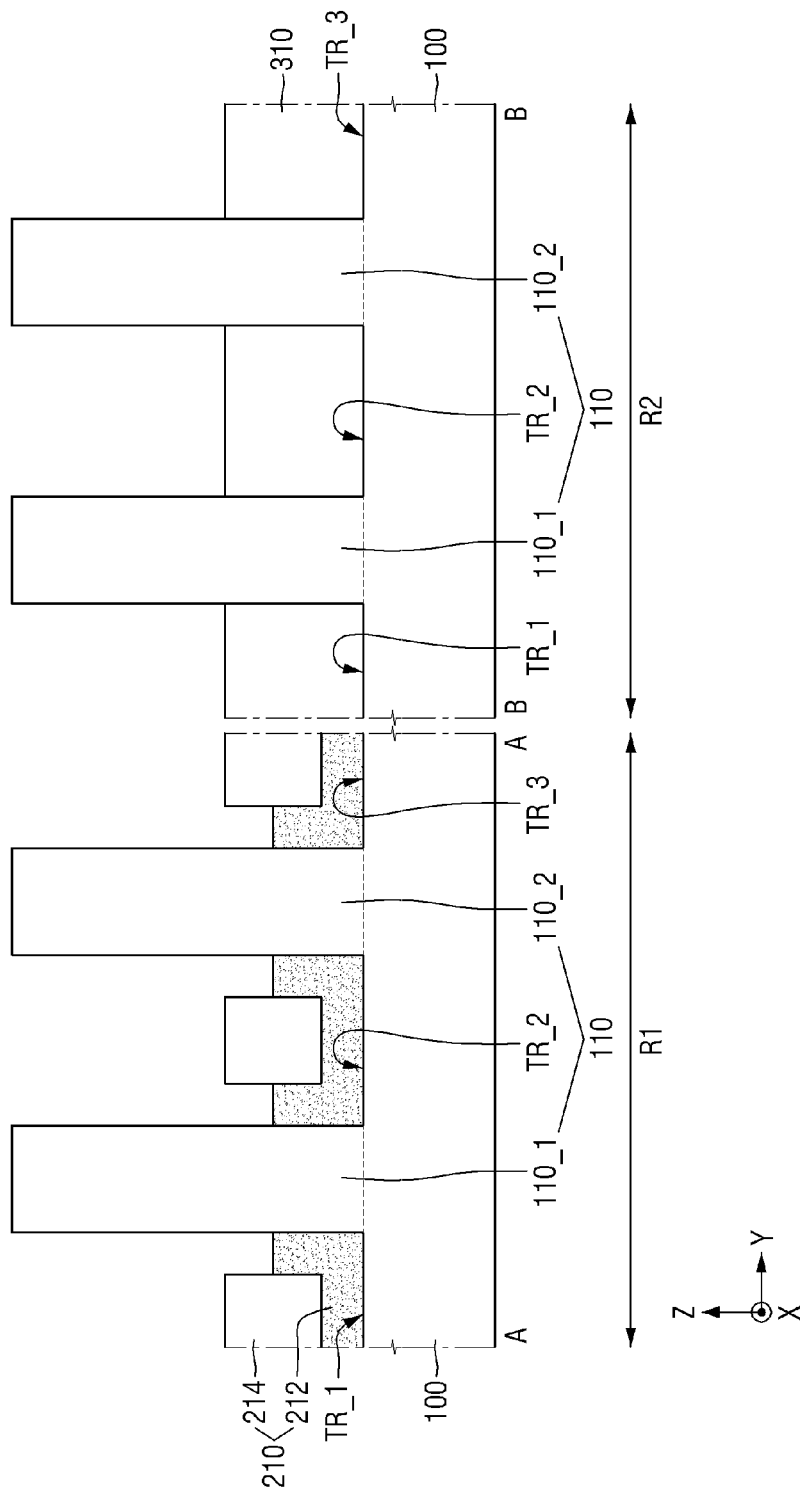
Figure 23:
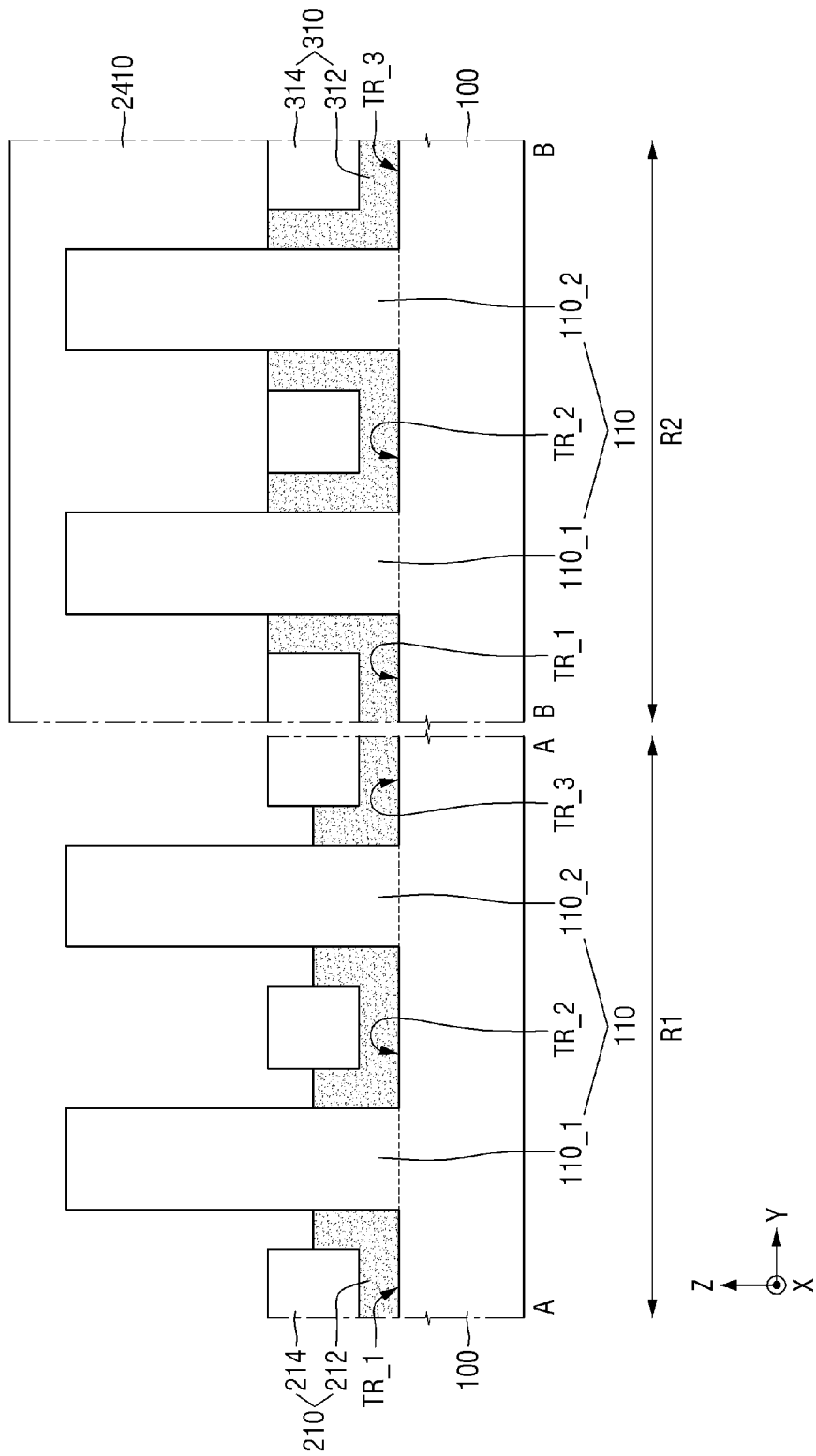
Figure 24:
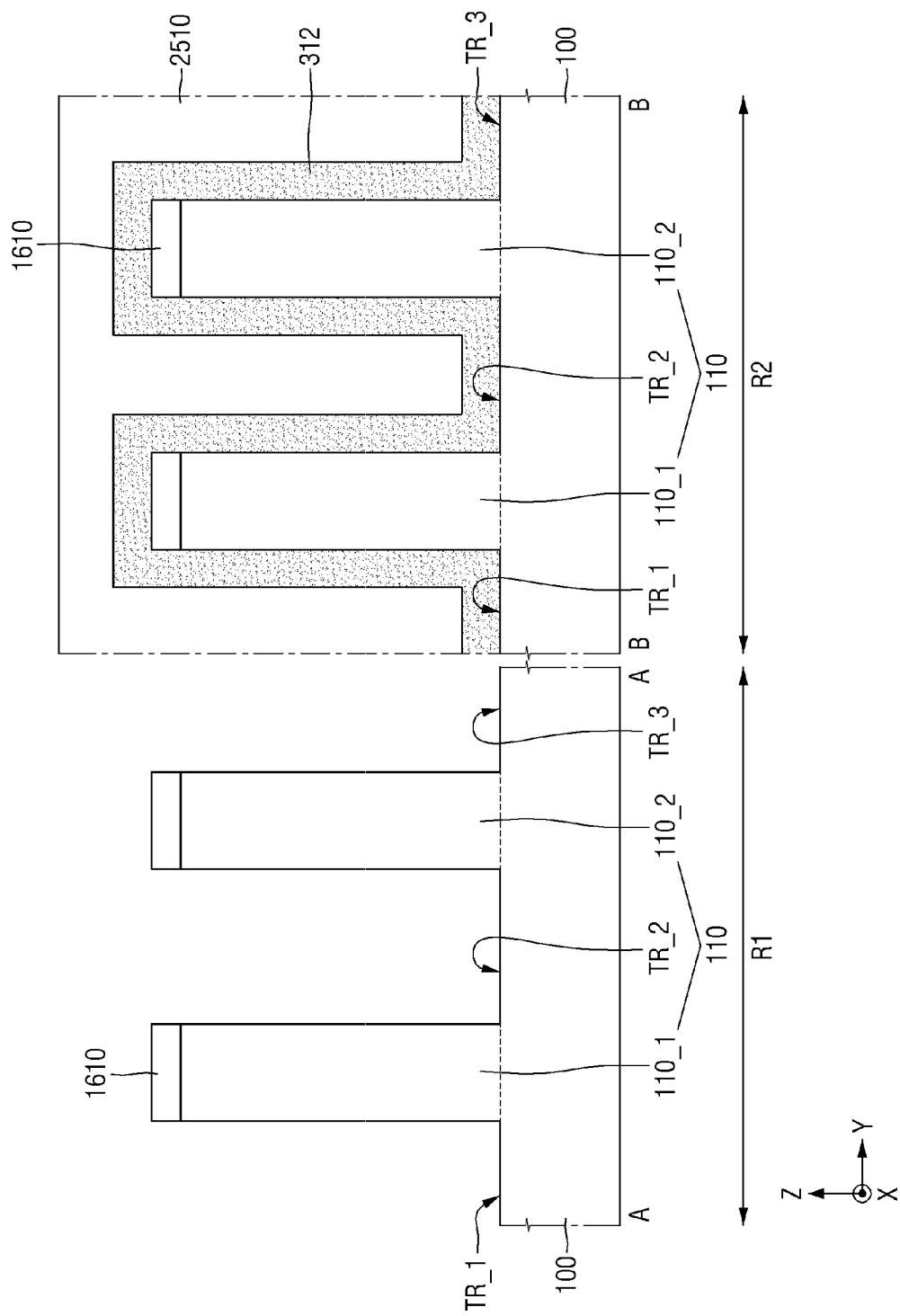
Figure 25:
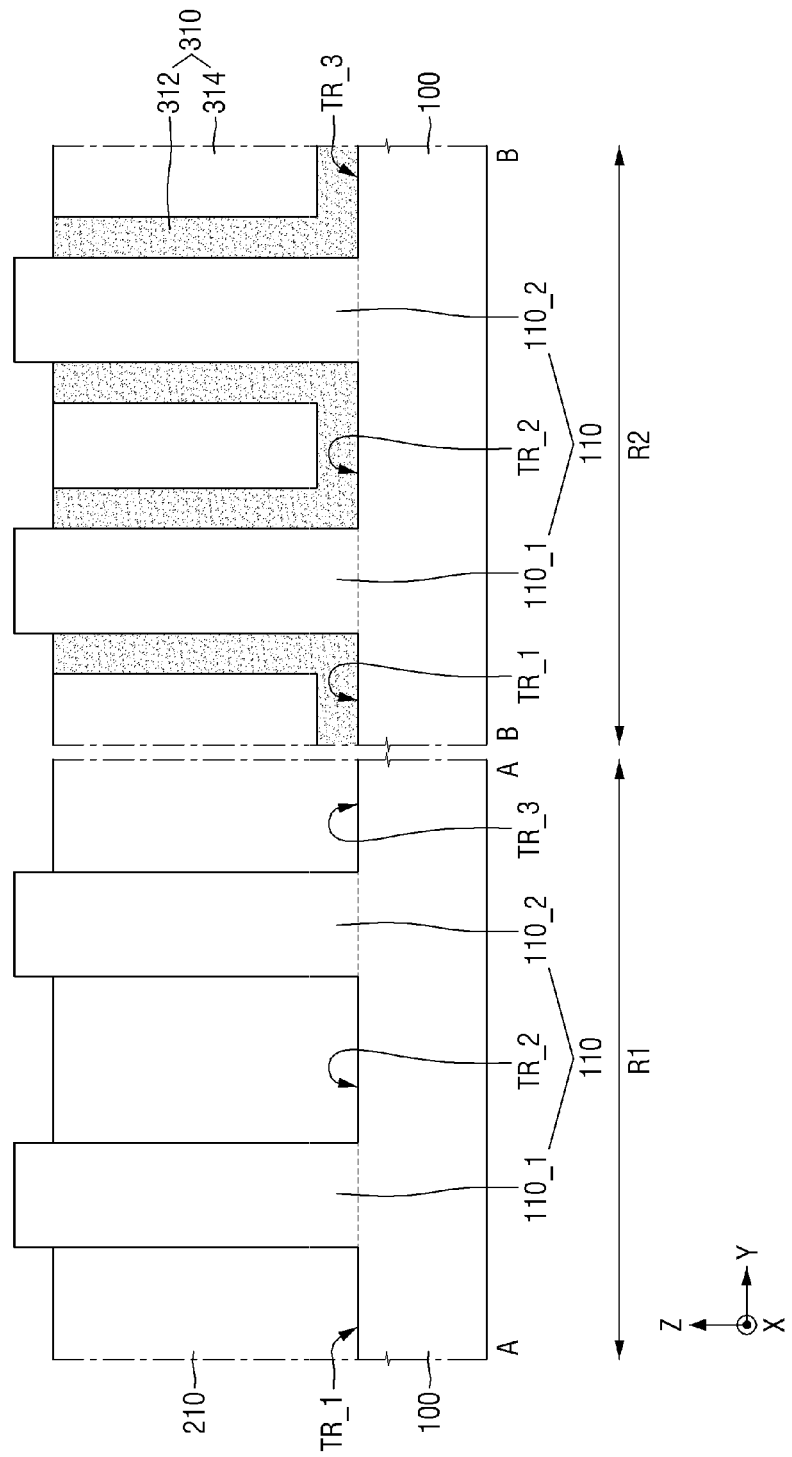
Figure 26:
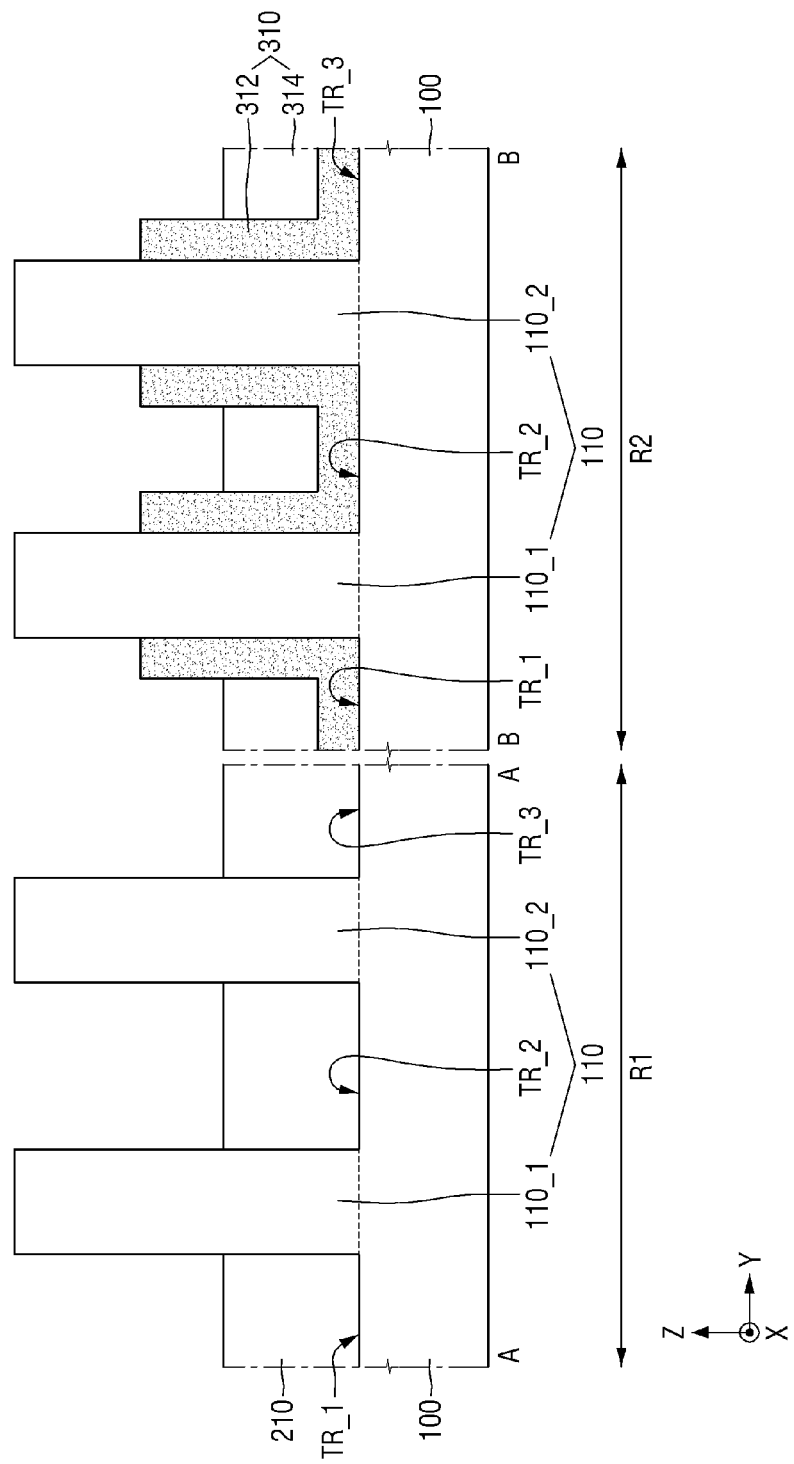
Figure 27:
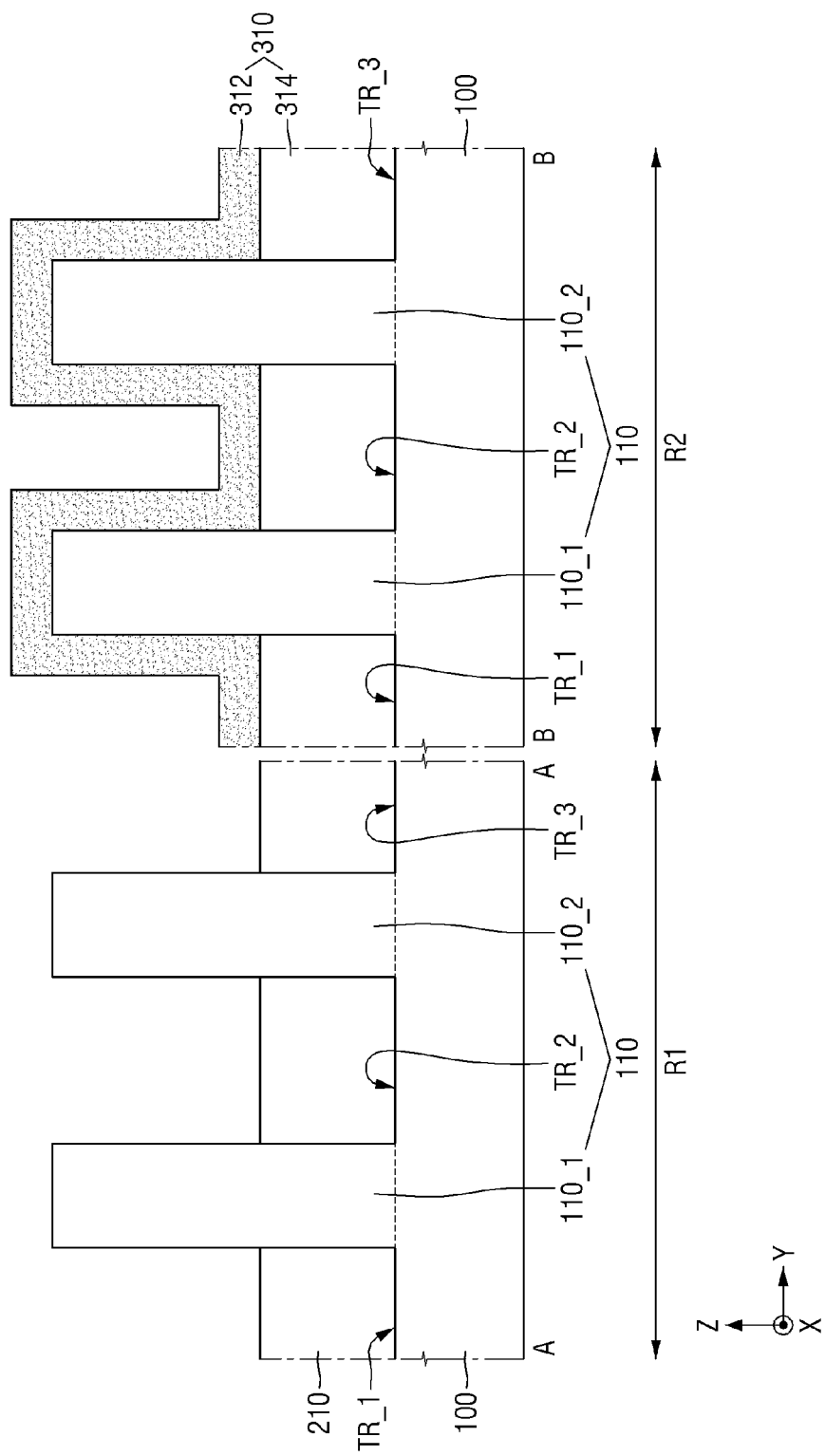
Figure 28:
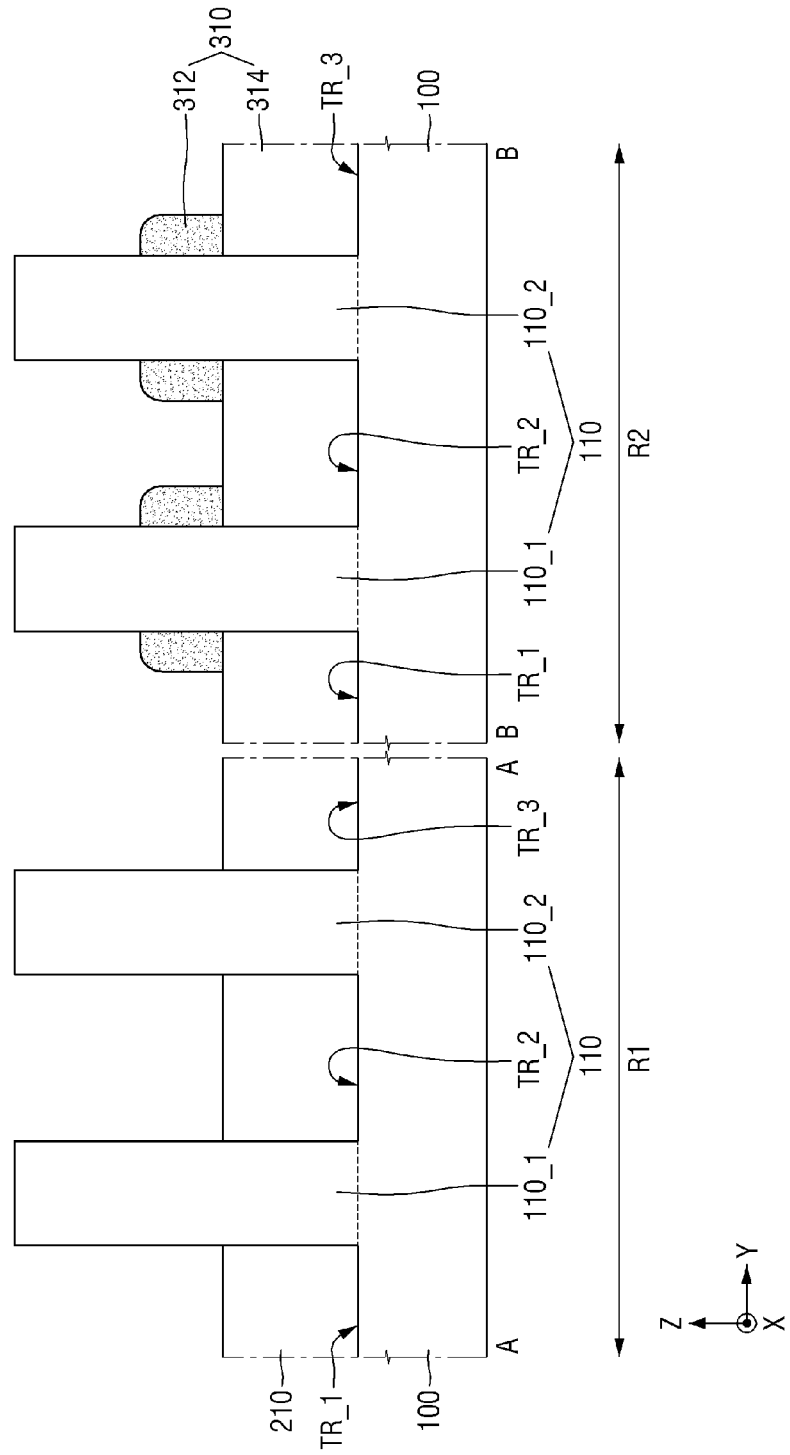
Figure 29:
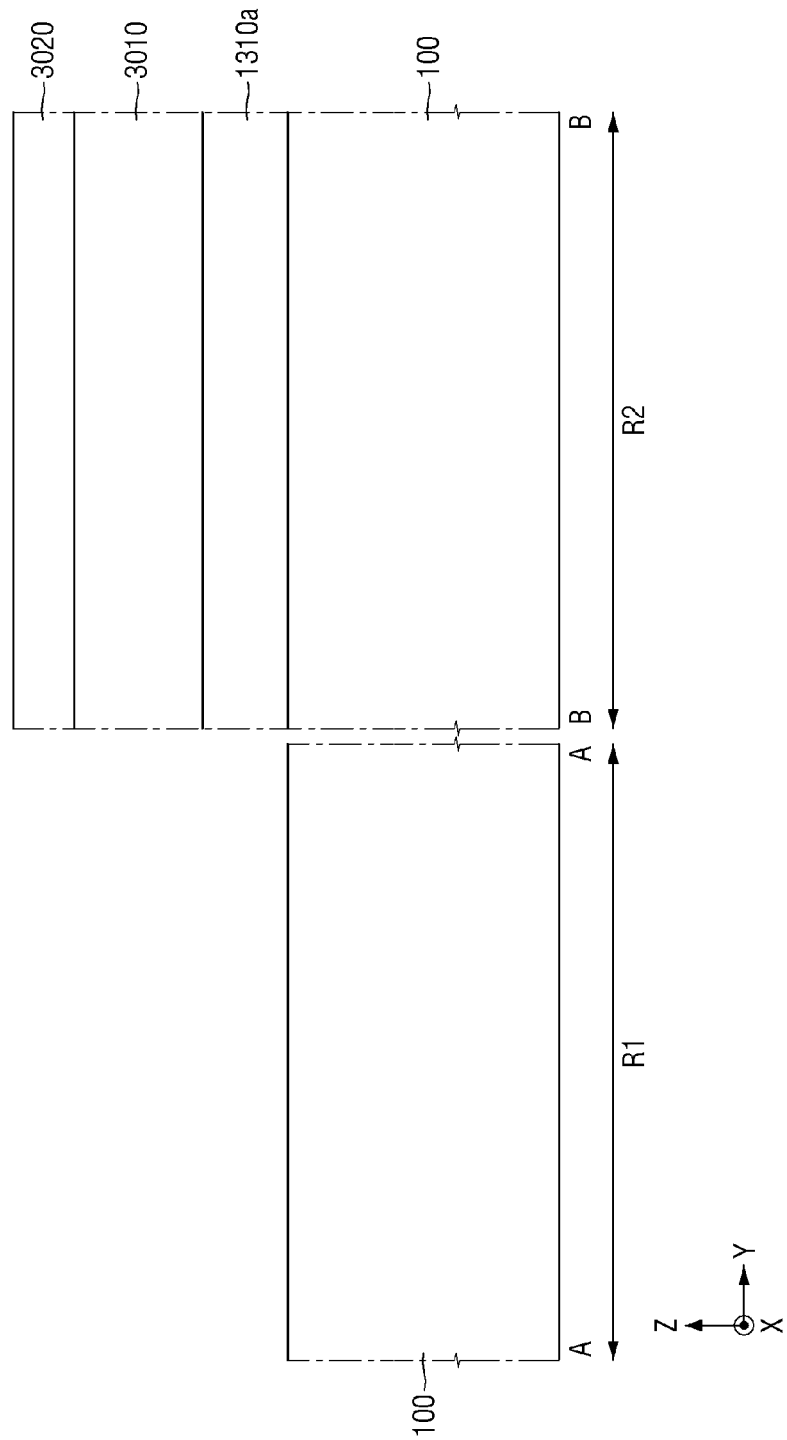
Figure 30:
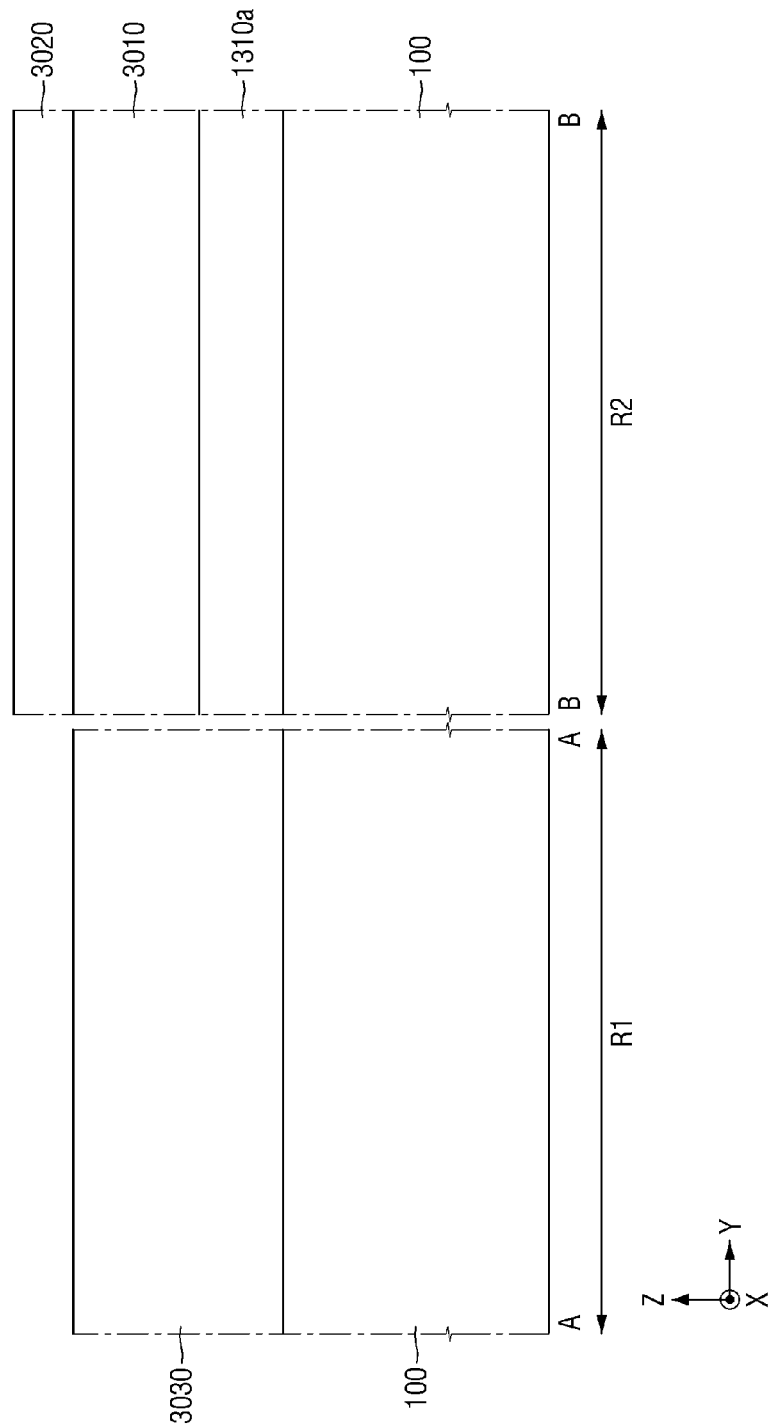
Figure 31:
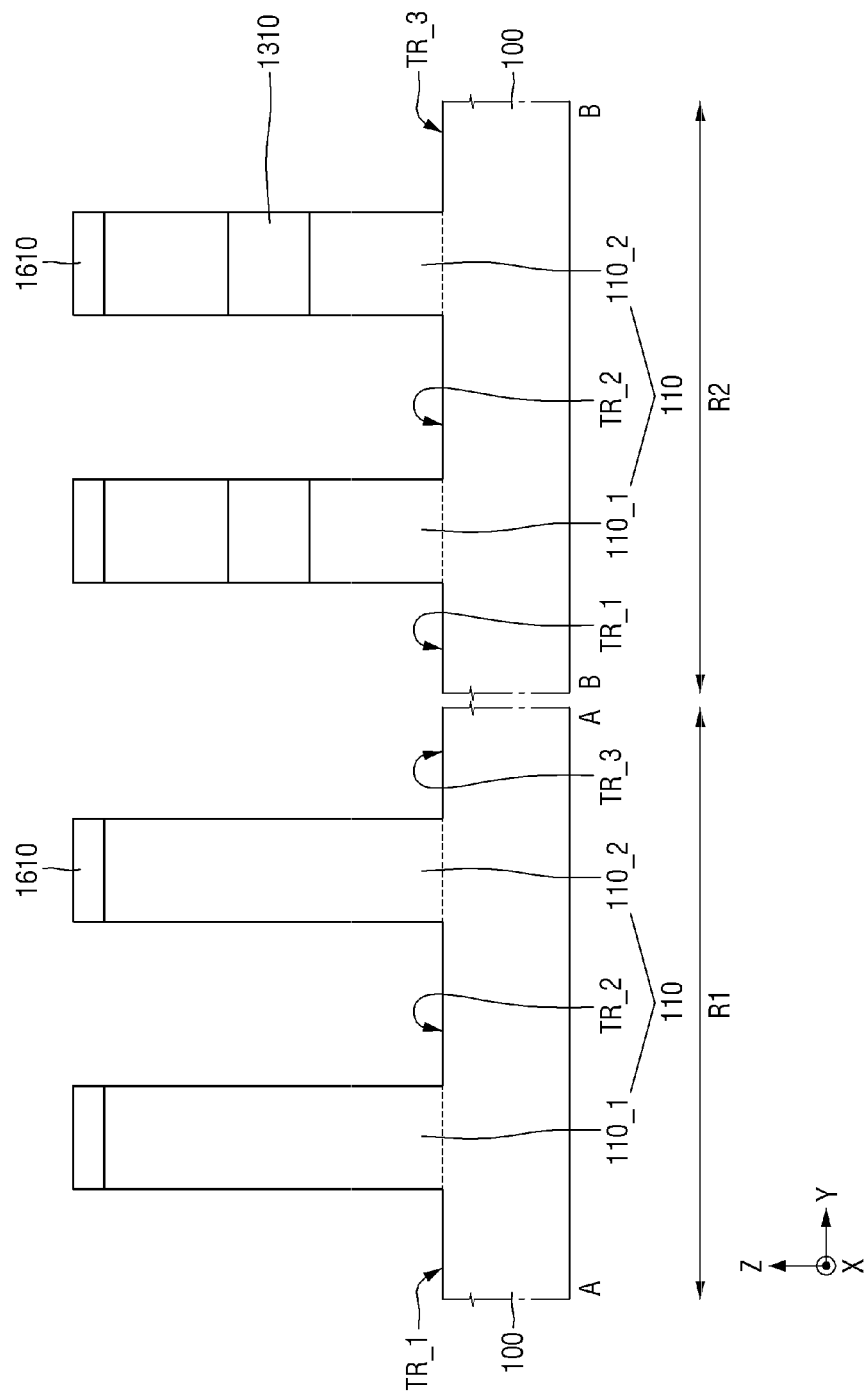
Figure 32:
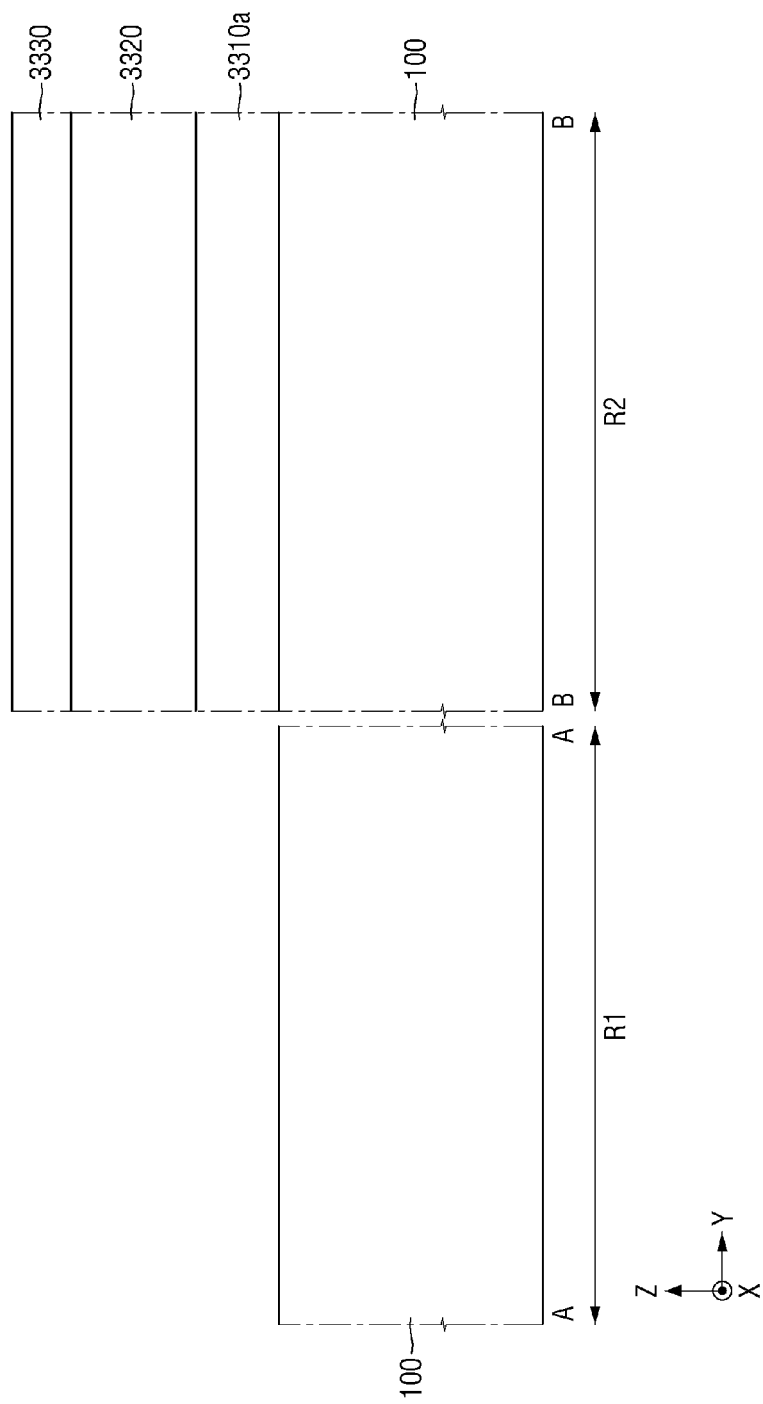
Figure 33:
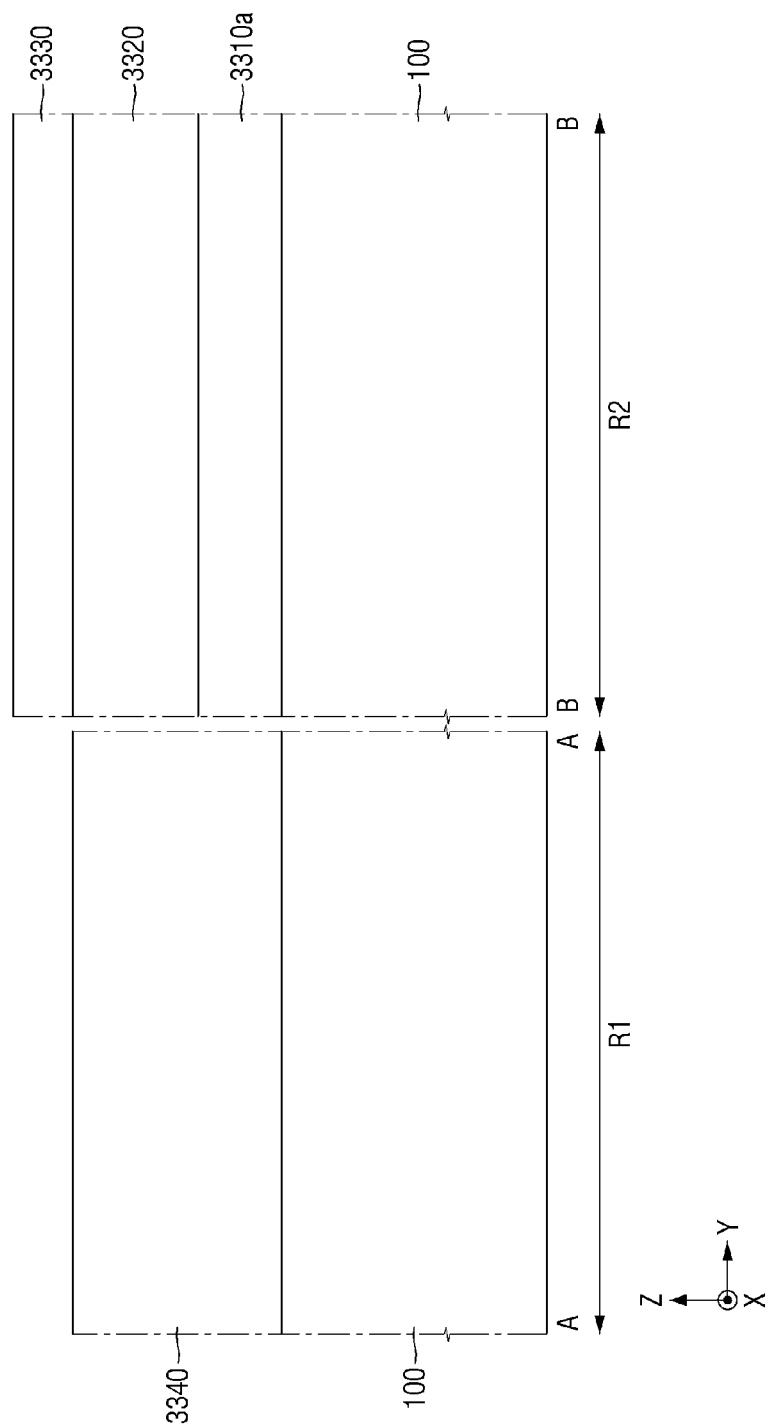
Figure 34:
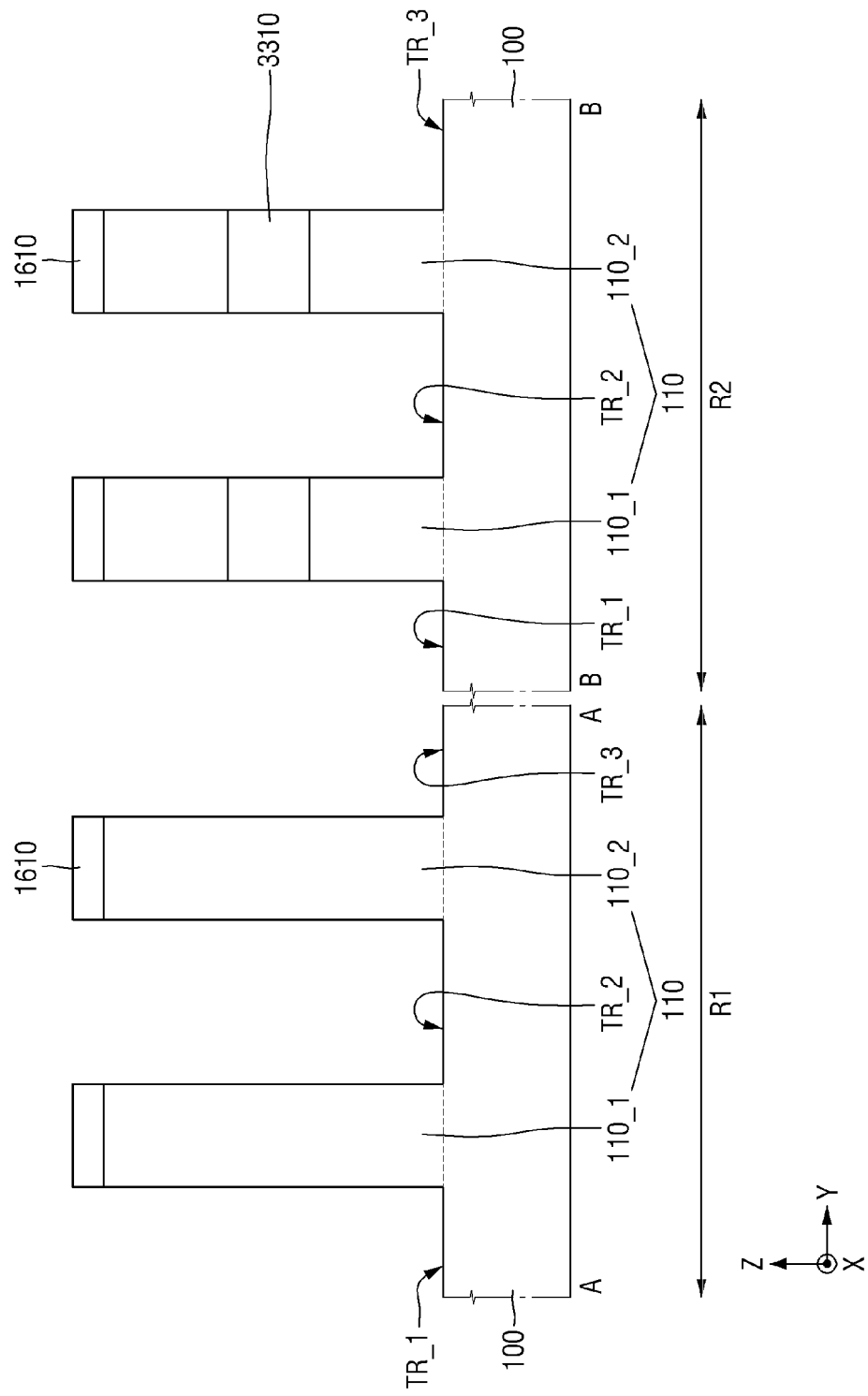

Referring to FIG. 18, first and second field insulating films 210 and 310 may be formed on the substrate 100. For example, in the first region R1, the first field insulating film 210 may be formed on the substrate 100. The first field insulating film 210 may be formed in the first region R1 to surround parts of the sidewalls of each of the first and second multichannel active patterns 110_1 and 110_2. In the second region R2, the second field insulating film 310 may be formed on the substrate 100. The second field insulating film 310 may be formed in the second region R2 to surround parts of the sidewalls of each of the first multichannel active patterns 110_1 and parts of the sidewalls of each of the second multichannel active patterns 110_2. For example, the first and second field insulating films 210 and 310 may be formed to fill parts of the first trenches TR_1, the second trenches TR_2, and the third trenches TR_3. The first and second insulating films 210 and 310 may be formed of the same isolation dielectric layer and may be formed in the same process. When viewed in a top-down view, this same isolation dielectric layer that forms the first and second insulating films 210 and 310 may completely surround the first multichannel active patterns 110_1 and the second multichannel active patterns 110_2, respectively.

In the second region R2, the second field insulating film 310 may be etched to a second thickness T2. During the etching of the second field insulating film 310, the first hard mask 1610 may also be etched. However, the present disclosure is not limited to this. For example, the first hard mask 1610 may be etched before the formation of the first and second field insulating films 210 and 310 or before the etching of the second field insulating film 310. A second hard mask 1910 may be formed only on the second field insulating film 310 and the first and second multichannel active patterns 110_1 and 110_2 in the second region R2. For example, in the second region R2, the second hard mask 1910 may be formed to surround and cover the first multichannel active patterns 110_1, the second multichannel active patterns 110_2, and the second field insulating film 310. Thereafter, in the first region R1, the first field insulating film 210 may be etched to a first thickness T1. Thereafter, the second hard mask 1910 is removed, and first and second gate structures 120 and 130 are formed on the first and second field insulating films 210 and 310, respectively.

A method of fabricating a semiconductor device according to some example embodiments of the present disclosure will hereinafter be described with reference to FIGS. 1, 9, 10, 16, 17A, and 20 through 22B.

Multichannel active patterns 110 may be formed on a substrate 100. First and second insulating liners 212 and 312 may be formed along the profile of the top surface of the substrate 100 and the profile of the sidewalls and the top surface of each of the multichannel active patterns 110. For example, the first and second insulating liners 212 and 312 may be formed conformally on the substrate 100 and each of the multichannel active patterns 110. Specifically, in the first region R1, the first insulating liner 212 may be formed along the profile of the top surface of the substrate 100 and the profile of the sidewalls and the top surface of each of the multichannel active patterns 110 and the hard mask 1610. In the second region R2, the second insulating liner 312 may be formed along the profile of the top surface of the substrate 100 and the profile of the sidewalls and the top surface of each of the multichannel active patterns 110 and the hard mask 1610. The first and second insulating liners 212 and 312 may be comprised of the same material and may be formed in the same process.

Thereafter, a third hard mask 2210 may be formed in the first region R1. Specifically, the third hard mask 2210 may be formed to cover the first insulating liner 212 in the first region R1. The second insulating liner 312 in the second region R2 may be removed by a selective etching process.

Thereafter, the third hard mask 2210 is removed, and in the first region R1, a first filling insulating film 214 is formed on the first insulating liner 212. In the second region R2, a second field insulating film 310 is formed on the substrate 100. The first filling insulating film 214 and the second field insulating film 310 may comprise the same material.

The first insulating liner 212, the first filing insulating film 214, and the second field insulating film 310 are etched such that their uppermost surfaces are on the same plane, and the first and second field insulating films 210 and 310 are etched using the etching selectivity of the first filling insulating film 214 with respect to the first insulating liner 212. For example, during the etching of the first filling insulating film 214, the rate at which the first filling insulating film 214 is etched may be lower than the rate at which the first insulating liner 212 is etched. Accordingly, the uppermost surface of the first insulating liner 212 may become lower than the uppermost surface of the first filling insulating film 214. Thereafter, first and second gate structures 120 and 130 are formed on the first and second filling insulating films 210 and 310, respectively.

A method of fabricating a semiconductor device according to some example embodiments of the present disclosure will hereinafter be described with reference to FIGS. 1, 9, 11, 16, 17A, and 20 through 23.

Multichannel active patterns 110 are formed on a substrate 100. First and second insulating liners 212 and 312 are formed along the profile of the top surface of the substrate 100 and the profile of the sidewalls and the top surface of each of the multichannel active patterns 110.

First and second filling insulating films 214 and 314 are formed on the first and second insulating liners 212 and 312, respectively. The first and second filling insulating films 214 and 314 and the first and second insulating liners 212 and 312 are etched such that their uppermost surfaces are on the same plane.

In a second region R2, a third hard mask 2410 is formed to cover the substrate 100, the second field insulating film 310, and the multichannel active patterns 110. In a first region R1, the first insulating liner 212 is recessed such that the uppermost surface of the first insulating liner 212 becomes lower than the uppermost surface of the first filing insulating film 214.

The third hard mask 2410 is removed, and first and second gate structures 120 and 130 are formed on the first and second field insulating films 210 and 310, respectively. The uppermost surfaces of the first and second filling insulating films 214 and 314 are illustrated as existing on the same plane, but the present disclosure is not limited. For example, the uppermost surface of the first filling insulating film 214 may be lower than the uppermost surface of the second filling insulating film 314.

A method of fabricating a semiconductor device according to some example embodiments of the present disclosure will hereinafter be described with reference to FIGS. 1, 2, 12, 16, 17A, 20, and 24 through 26.

Multichannel active patterns 110 are formed on a substrate 100. First and second insulating liners 212 and 312 are formed along the profile of the top surface of the substrate 100 and the profile of the sidewalls and the top surface of each of the multichannel active patterns 110. In a second region R2, a fourth hard mask 2510 is formed to cover the substrate 100, each of the multichannel active patterns 110, and the second insulating liner 312. Thereafter, the first insulating liner 212 is removed from a first region R1.

In the first region R1, a first field insulating film 210 is formed, and in the second region R2, a second filling insulating film 314 is formed. The first field insulating film 210, the second insulating liner 312, and the second filling insulating film 314 are etched such that their uppermost surfaces are on the same plane.

Thereafter, the first and second field insulating films 210 and 310 are etched. In some example embodiments, the second insulating liner 312 may have etching selectivity with respect to the second filling insulating film 314. For example, during the etching of the second field insulating film 310, the rate at which the second insulating liner 312 is etched may differ from the rate at which the second filling insulating film 314 is etched. For example, the rate at which the second insulating liner 312 is etched may be lower than the rate at which the second filling insulating film 314 is etched. The uppermost surface of the second insulating liner 312 may protrude beyond the uppermost surface of the second filling insulating film 314. Thereafter, first and second gate structures 120 and 130 are formed on the first and second field insulating films 210 and 310, respectively.

A method of fabricating a semiconductor device according to some example embodiments of the present disclosure will hereinafter be described with reference to FIGS. 1, 2, 13, 16, 17A, 27, and 28.

Multichannel active patterns 110 are formed on a substrate 100. A first field insulating film 210 and a second filling insulating film 314 may be formed to cover parts of the multichannel active patterns 110. In a second region R2, a second insulating liner 312 may be formed along the profile of the second filling insulating film 314 and the profile of the sidewalls and the top surface of each of the multichannel active patterns 110.

The second insulating liner 312 may be etched such that it may exist only on parts of the sidewalls of each of the multichannel active patterns 110. Thereafter, a first gate structure 120 is formed on the first field insulating film 210, and a second gate structure 130 is formed on a second field insulating film 310.

A method of fabricating a semiconductor device according to some example embodiments of the present disclosure will hereinafter be described with reference to FIGS. 1, 2, 14, and 29 through 31.

In a second region R2, a first insulating film 1310a is formed on a substrate 100. A sub-substrate 3010 is formed on the first insulating film 1310a. A fifth hard mask 3020 is formed on the sub-substrate 3010.

In a first region R1, an epitaxial substrate 3030 is formed on the substrate 100. The epitaxial substrate 3030 may be formed by selective epitaxial growth (SEG).

The fifth hard mask 3020 is removed, and in the first region R1, multichannel active patterns 110 are formed using a first hard mask 1610. In the second region R2, multichannel active patterns 110 including first insulating patterns 1310 are formed using the first hard mask 1610. First and second field insulating films 210 and 310 are formed on the multichannel active patterns 110. Thereafter, first and second gate structures 120 and 130 are formed on the first and second field insulating films 210 and 310, respectively.

A method of fabricating a semiconductor device according to some example embodiments of the present disclosure will hereinafter be described with reference to FIGS. 1, 2, 14, and 32 through 34.

In a second region R2, a first sacrificial film 3310a is formed on a substrate 100. A sub-substrate 3320 is formed on the first sacrificial film 3310a. A sixth hard mask 3330 is formed on the sub-substrate 3320. The first sacrificial film 3310a may comprise, for example, silicon germanium (SiGe).

In a first region R1, an epitaxial substrate 3040 is formed on the substrate 100. The epitaxial substrate 3040 may be formed by SEG. The sixth hard mask 3330 is removed, and in the first region R1, multichannel active patterns 110 are formed using a first hard mask 1610. In the second region R2, multichannel active patterns 110 including first sacrificial patterns 3310 are formed using the first hard mask 1610. First and second field insulating films 210 and 310 are formed on the multichannel active patterns 110. The first sacrificial patterns 3310 may be replaced later with a second gate structure 130 by a replacement process.

Although some embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A semiconductor device comprising:
   a substrate including a first region and a second region;
   a first active pattern disposed on the first region of the substrate and the second region of the substrate;
   a second active pattern disposed on the first region of the substrate and the second region of the substrate;
   a first gate structure disposed on the first region of the substrate, and disposed on the first active pattern and the second active pattern, the first gate structure including a first gate insulating film and a first gate electrode;
   a second gate structure disposed on the second region of the substrate, and disposed on the first active pattern and the second active pattern, the second gate structure including a second gate insulating film and a second gate electrode;
   a first field insulating film disposed on the first region of the substrate, and disposed between the first active pattern and the second active pattern; and
   a second field insulating film disposed on the second region of the substrate, and disposed between the first active pattern and the second active pattern,
   wherein the first active pattern includes a fin structure in the first region of the substrate and a nanowire structure in the second region of the substrate.

2. The semiconductor device of claim 1, wherein the second active pattern includes the fin structure in the first region of the substrate and the nanowire structure in the second region of the substrate.

3. The semiconductor device of claim 1, wherein the second active pattern includes the nanowire structure in the first region of the substrate and the fin structure in the second region of the substrate.

4. The semiconductor device of claim 1, wherein the second active pattern includes the nanowire structure in the first region of the substrate and the nanowire structure in the second region of the substrate.

5. The semiconductor device of claim 1, wherein the second active pattern includes the fin structure in the first region of the substrate and the fin structure in the second region of the substrate.

6. The semiconductor device of claim 1,
   wherein the first active pattern includes a first channel in the first region of the substrate and a second channel in the second region of the substrate, and
   wherein the second active pattern includes a third channel in the first region of the substrate and a fourth channel in the second region of the substrate.

7. The semiconductor device of claim 6,
   wherein a width of the first channel is different from a width of the second channel, and
   wherein a width of the third channel is different from a width of the fourth channel.

8. The semiconductor device of claim 6,
   wherein a width of the first channel is substantially equal to a width of the second channel, and wherein a width of the third channel is substantially equal to a width of the fourth channel.

9. The semiconductor device of claim 1,
wherein the first active pattern includes a first portion protruding from a top surface of the first field insulating film in the first region of the substrate, and a second portion protruding from a top surface of the second field insulating film in the second region of the substrate, and
wherein a height of the first portion of the first active pattern is different from a height of the second portion of the first active pattern.

10. A semiconductor device comprising:
a substrate including a first region and a second region;
a first active pattern disposed on the first region of the substrate and the second region of the substrate;
a second active pattern disposed on the first region of the substrate and the second region of the substrate;
a first gate structure disposed on the first region of the substrate, and disposed on the first active pattern and the second active pattern, the first gate structure including a first gate insulating film and a first gate electrode;
a second gate structure disposed on the second region of the substrate, and disposed on the first active pattern and the second active pattern, the second gate structure including a second gate insulating film and a second gate electrode;
a first field insulating film disposed on the first region of the substrate, and disposed between the first active pattern and the second active pattern; and
a second field insulating film disposed on the second region of the substrate, and disposed between the first active pattern and the second active pattern,
wherein the first active pattern includes one of a fin structure and a nanowire structure in the first region of the substrate, and one of the fin structure and the nanowire structure in the second region of the substrate,
wherein the second active pattern includes one of the fin structure and the nanowire structure in the first region of the substrate, and one of the fin structure and the nanowire structure in the second region of the substrate,
wherein the first active pattern includes a first channel in the first region of the substrate and a second channel in the second region of the substrate, and
wherein the second active pattern includes a third channel in the first region of the substrate and a fourth channel in the second region of the substrate.

11. The semiconductor device of claim 10,
wherein the first field insulating film includes a first insulating liner and a first filling insulating film,
wherein the first insulating liner is disposed on the substrate, on a sidewall of the first active pattern, and on a sidewall of the second active pattern, and
wherein the first filling insulating film is disposed on the first insulating liner.

12. The semiconductor device of claim 11, wherein a top surface of the first insulating liner is higher than a bottom surface of the first gate structure.

13. The semiconductor device of claim 10,
wherein the second field insulating film includes a second insulating liner and a second filling insulating film,
wherein the second filling insulating film is disposed on the substrate, and
wherein the second insulating liner is disposed on the second filling insulating film.

14. The semiconductor device of claim 13, wherein a bottom surface of the second insulating liner is substantially coplanar with a bottom surface of the first gate structure.

15. A semiconductor device comprising:
a substrate including a first region and a second region;
a first active pattern disposed on the first region of the substrate and the second region of the substrate;
a second active pattern disposed on the first region of the substrate and the second region of the substrate;
a first gate structure disposed on the first region of the substrate, and disposed on the first active pattern and the second active pattern, the first gate structure including a first gate insulating film and a first gate electrode;
a second gate structure disposed on the second region of the substrate, and disposed on the first active pattern and the second active pattern, the second gate structure including a second gate insulating film and a second gate electrode;
a first field insulating film disposed on the first region of the substrate, and disposed between the first active pattern and the second active pattern; and
a second field insulating film disposed on the second region of the substrate, and disposed between the first active pattern and the second active pattern,
wherein the first active pattern includes a nanowire structure in the first region of the substrate,
wherein the second active pattern includes the nanowire structure in the first region of the substrate,
wherein the first active pattern includes a first channel in the first region of the substrate and a second channel in the second region of the substrate, and
wherein the second active pattern includes a third channel in the first region of the substrate and a fourth channel in the second region of the substrate.

16. The semiconductor device of claim 15,
wherein the first active pattern includes the nanowire structure in the second region of the substrate, and
wherein the second active pattern includes the nanowire structure in the second region of the substrate.

17. The semiconductor device of claim 15,
wherein the first active pattern includes a fin structure in the second region of the substrate, and
wherein the second active pattern includes the fin structure in the second region of the substrate.

18. The semiconductor device of claim 15,
wherein the first active pattern includes the nanowire structure in the second region of the substrate, and
wherein the second active pattern includes a fin structure in the second region of the substrate.

19. The semiconductor device of claim 15,
wherein a width of the first channel is different from a width of the second channel, and
wherein a width of the third channel is different from a width of the fourth channel.

20. The semiconductor device of claim 15,
wherein the first field insulating film includes a first insulating liner and a first filling insulating film,
wherein the first insulating liner is disposed on the substrate, and
wherein the first filling insulating film is disposed on the first insulating liner.

* * * * *